(12) United States Patent
Ma et al.

(10) Patent No.: US 11,709,562 B2
(45) Date of Patent: *Jul. 25, 2023

(54) SEMICONDUCTOR DEVICE

(71) Applicant: Japan Display inc., Tokyo (JP)

(72) Inventors: Chunche Ma, Tokyo (JP); Hajime Akimoto, Tokyo (JP)

(73) Assignee: Japan Display Inc., Tokyo (JP)

( * ) Notice: Subject to any disclaimer, the term of this patent is extended or adjusted under 35 U.S.C. 154(b) by 245 days.

This patent is subject to a terminal disclaimer.

(21) Appl. No.: 17/117,478

(22) Filed: Dec. 10, 2020

(65) Prior Publication Data

US 2021/0089186 A1 Mar. 25, 2021

Related U.S. Application Data

(63) Continuation of application No. 16/028,493, filed on Jul. 6, 2018, now Pat. No. 10,886,308.

(30) Foreign Application Priority Data

Aug. 9, 2017 (JP) ................................. 2017-153921

(51) Int. Cl.
| | |
|---|---|
| *G06F 3/041* | (2006.01) |
| *H01L 27/12* | (2006.01) |
| *G06F 3/04842* | (2022.01) |
| *G06F 3/044* | (2006.01) |

(52) U.S. Cl.
CPC .......... *G06F 3/04164* (2019.05); *G06F 3/044* (2013.01); *G06F 3/0416* (2013.01); *G06F 3/0445* (2019.05); *G06F 3/0446* (2019.05); *G06F 3/0447* (2019.05); *G06F 3/04842* (2013.01); *H01L 27/124* (2013.01); *H01L 27/1218* (2013.01); *H01L 27/1248* (2013.01); *G06F 3/0412* (2013.01); *G06F 3/0414* (2013.01); *G06F 2203/04103* (2013.01); *G06F 2203/04105* (2013.01)

(58) Field of Classification Search
CPC .......... G02F 1/13338; G02F 1/133305; H01L 2251/5338; H01L 29/78633
See application file for complete search history.

(56) References Cited

U.S. PATENT DOCUMENTS

| | | | |
|---|---|---|---|
| 10,886,308 B2* | 1/2021 | Ma | ....................... H01L 27/1248 |
| 2016/0254276 A1* | 9/2016 | Tada | ................. H01L 29/78633 |
| | | | 257/72 |
| 2017/0308212 A1* | 10/2017 | Jin | ......................... G06F 3/0412 |
| 2019/0079626 A1* | 3/2019 | Liu | ...................... G02F 1/13338 |

\* cited by examiner

*Primary Examiner* — Peter M Albrecht
(74) *Attorney, Agent, or Firm* — Michael Best & Friedlich LLP

(57) ABSTRACT

A display device includes a flexible substrate, a plurality of TFTs, a first electrode arranged between a channel of one of the plurality of TFTs and the flexible substrate, at least one inorganic insulating film arranged between one of the plurality of TFTs and the first electrode, a second electrode arranged on the opposite side to the side where one of the plurality of TFTs is arranged with respect to the first electrode, and an organic insulating film arranged between the first electrode and the second electrode.

7 Claims, 20 Drawing Sheets

SEMICONDUCTOR DEVICE

CROSS REFERENCE TO RELATED APPLICATIONS

This application is a continuation of U.S. patent application Ser. No. 16/028,493, filed on Jul. 6, 2018. Further, this application is based upon and claims the benefit of priority from the prior Japanese Patent Application No. 2017-153921, filed on Aug. 9, 2017, the entire contents of which are incorporated herein by reference.

FIELD

An embodiment of the present invention is related to a display device. In particular, the present invention is related to a display device with a force sensor.

BACKGROUND

A display device in which a display panel and an input device are integrally arranged is known. The display panel is, for example, a liquid crystal panel. The input device is, for example, a touch sensor or a pressure sensor which can detect a pressing pressure. By adding a touch sensor or a pressing sensor which can detect pressing to the display device, it is possible to realize a multifunctional display device. In addition, in recent years, an organic electroluminescence (EL) display panel has begun to spread as a display panel. The EL display panel can realize a weight reduction of the display panel and low power consumption.

For example, an information input device in which a display device and an input device are integrally arranged, and the manufacturing process of the device is simplified by simplifying the arrangement of a pressure sensor is disclosed in Japanese Laid Open Patent Application No. 2017-10106.

SUMMARY

An embodiment of the present invention is a display device including a flexible substrate, a plurality of thin film transistors (TFTs), a first electrode arranged between a channel of one of the plurality of TFTs and the flexible substrate, at least one organic insulating film arranged between one of the plurality of TFTs and the first electrode, a second electrode arranged on the opposite side to the side where one of the plurality of TFTs is arranged with respect to the first electrode, and an organic insulating film arranged between the first electrode and the second electrode.

DESCRIPTION OF EMBODIMENTS

Figure 1:
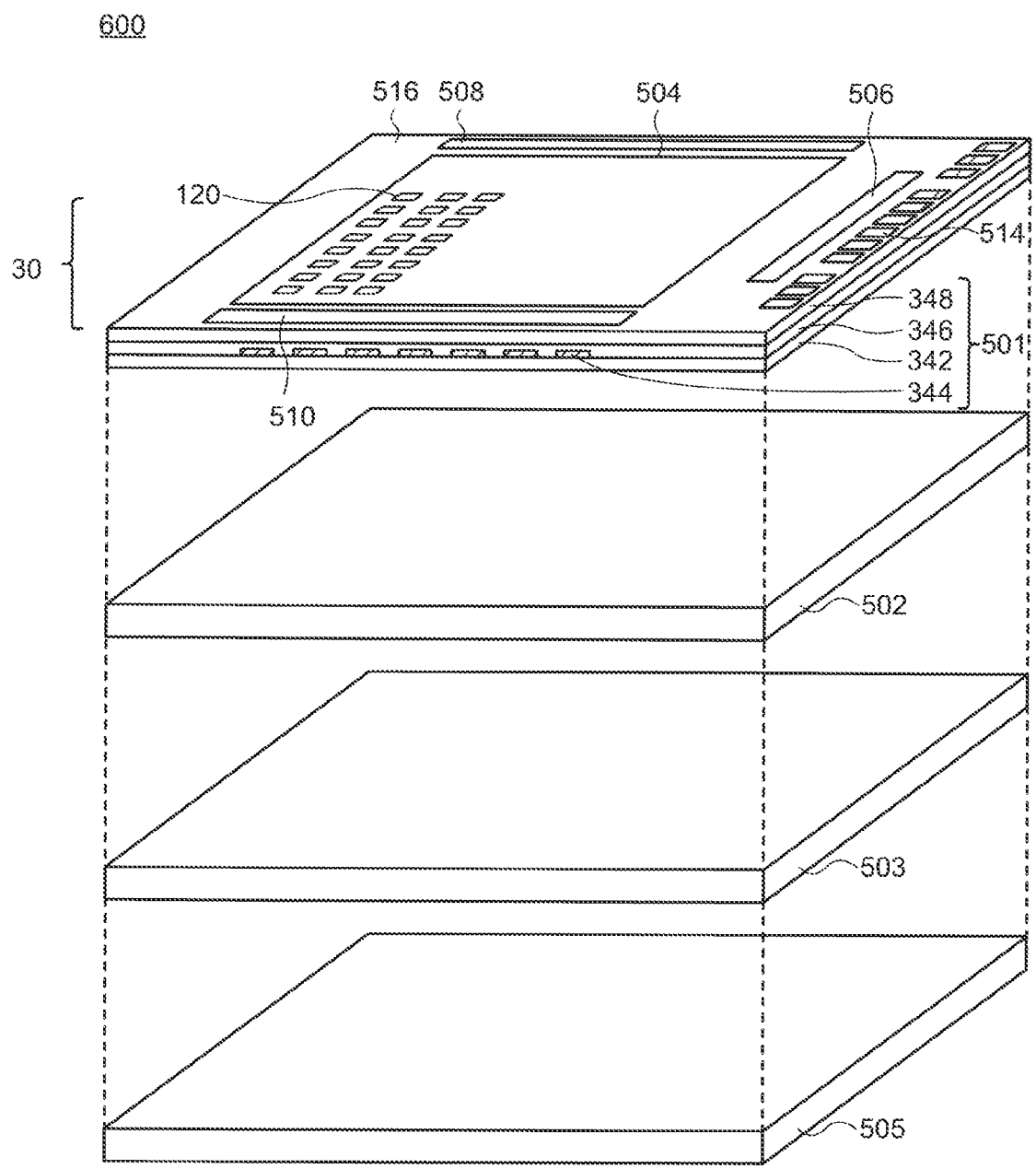
FIG. 1 is a schematic perspective view showing a display device related to one embodiment of the present invention.

The embodiments of the present invention are explained below while referring to the diagrams. However, it is possible to perform the present invention using various different forms, and the present invention should not be limited to the content described in the embodiments exemplified herein. In addition, although the width, thickness and shape of each component are shown schematically compared to their actual form in order to better clarify explanation, the drawings are merely an example and should not limit an interpretation of the present invention. Furthermore, in the specification and each drawing, the same reference symbols (or symbols attached with a, b and the like after a numeral) attached to similar elements and elements that have been mentioned in previous drawings, and therefore a detailed explanation may be omitted where appropriate. Furthermore, characters denoted by [first] and [second] attached to each element appropriate symbols used for distinguishing each element and do not have any further meaning unless otherwise stated.

In the present specification, in the case where certain parts or regions are given as [above (or below)] other parts or regions, as long as there is no particular limitation, these include parts which are not only directly above (or directly below) other parts or regions but also in an upper direction (or lower direction). That is, the case where other structural elements are included between other parts or regions in an upper direction (or lower direction) is included. Furthermore, in the explanation herein, unless otherwise noted, in a cross-sectional view, a side where a second conductive layer is arranged with respect to a flexible substrate is referred to as [below] or [lower] and the reverse is referred to as [above] or [upper].

The flexible substrate explained in the present specification has at least a planar shaped main surface, and each layer of an insulating layer, a semiconductor film and a conductive layer, or each element such as a transistor and a light emitting element arranged above this main surface. In the following explanation, in a cross-sectional view, in the case where one main surface of the flexible substrate is used as a reference and [above], [upper layer], [upper] or [upper surface] are explained with respect to the flexible substrate, unless otherwise specified, an explanation is made with reference to the one main surface of the flexible substrate.

It is possible to make the display device multifunctional by adding a function for detecting pressing on the display device. On the other hand, in order to make the display device multifunctional, manufacturing costs increase since the manufacturing process of the display device becomes complex. Therefore, as well as making the display device multifunctional, simplifying the manufacturing process of the display device is a problem.

In view of such a problem, an object of one embodiment of the present invention is to provide a display device arranged with a pressure sensor having a simple manufacturing process.

First Embodiment

In the present embodiment, a structure of a display device arranged with a pressure sensor according to one embodiment of the present invention is explained. The display device arranged with a pressure sensor according to one embodiment of the present invention is an example of an EL display panel.

FIG. 1 is a schematic perspective view of a display device according to one embodiment of the present invention.

A display device 600 includes a layer 501 having a first conductive film, a flexible substrate 502, an organic insulating film 503 and a second conductive layer 505. The layer 501 having the first conductive film is formed by a first inorganic insulating film 342, a first conductive film 344, a second inorganic insulating film 346 and a third inorganic insulating film 348. The layer 501 having the first conductive film is arranged on an upper surface of the flexible substrate 502. The organic insulating film 503 and the second conductive layer 505 are arranged on a surface (lower surface) opposite to the upper surface of the flexible substrate 502. A pressure sensor is formed by the layer 501 having the first conductive film, the flexible substrate 502, the organic insulating film 503 and the second conductive layer 505. Furthermore, in FIG. 1, the first conductive film 344 is arranged between the first inorganic insulating film 342 and the second inorganic insulating film 346. However, the first conductive film 344 may also be arranged between the second inorganic insulating film 346 and the third inorganic insulating film 348.

A TFT (Thin Film Transistor) array layer 30 is arranged on the upper surface of the layer 501 having the first conductive film. The TFT array layer 30 includes a display region 504, an image signal line drive circuit 506, scanning signal line drive circuits 508 and 510, a terminal electrode 514 and a periphery region 516. The display region 504 includes pixels 120 for displaying an image on the display device 600. A pixel 120 has a plurality of TFTs and an image can be displayed on the display device 600 by driving the TFTs.

The organic insulating film 503 is compressed for example when the surface of the display device 600 is pressed by a finger. When the organic insulating film 503 is compressed in the region pressed by a finger, the distance between the layer 501 having the first conductive film in the region pressed by the finger and the second conductive layer 505 becomes shorter and the capacitance value between the first conductive film 344 and the second conductive layer 505 increases. By detecting a change in the current value used for charging and discharging the capacitance between the first conductive film 344 and the second conductive layer 505 before and after being pressed by a finger, a change in the capacitance value between the layer 501 having the first conductive film and the second conductive layer 505 is calculated. The layer 501 having the first conductive film has a plurality of first conductive films 344 (shown in FIG. 2). Furthermore, the organic insulating film 503 may also be arranged between the flexible substrate 502 and the layer 501 having the first conductive film.

Figure 2:
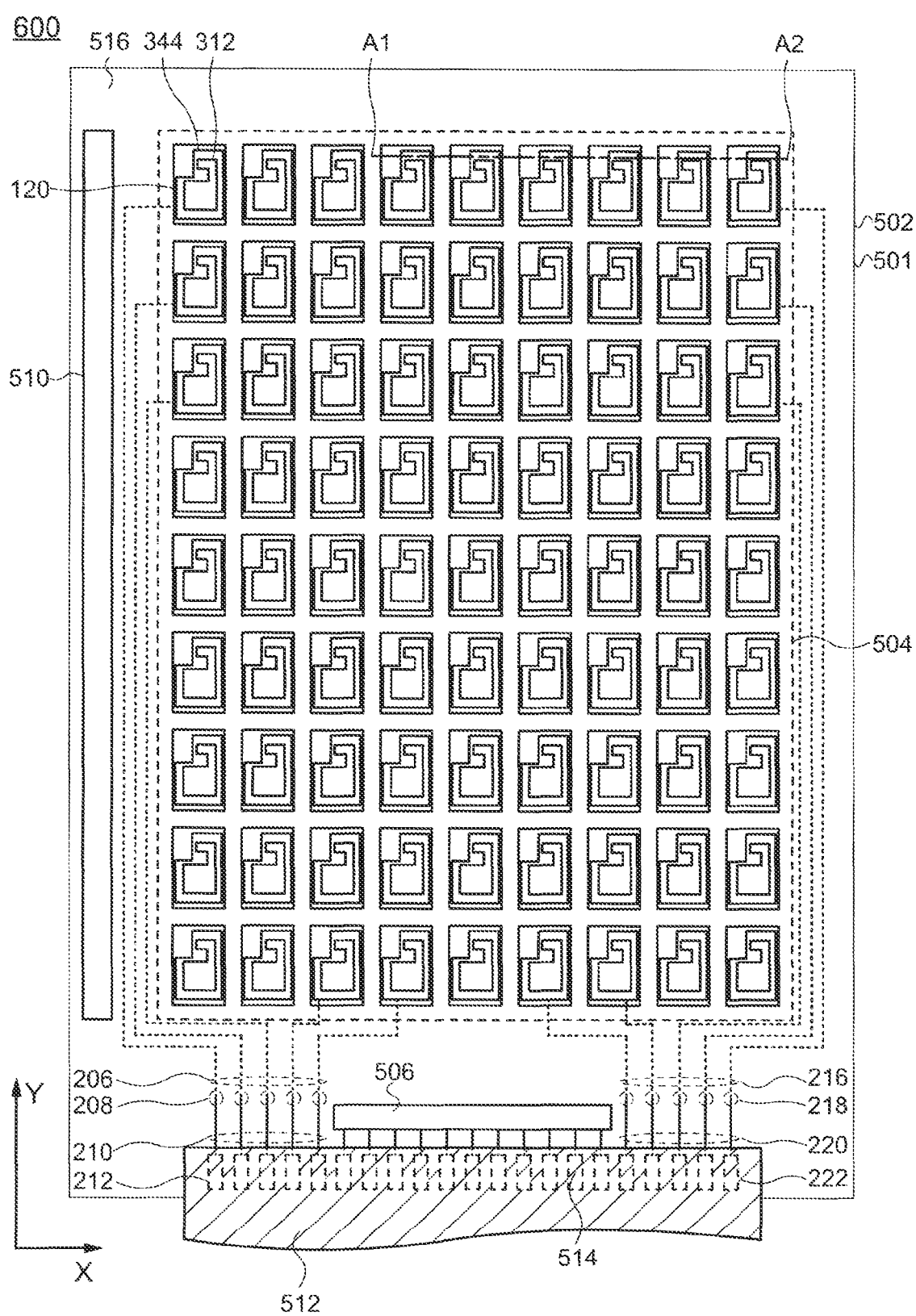
FIG. 2 is a schematic planar view showing a display device related to one embodiment of the present invention.

FIG. 2 is a schematic planar view diagram of the display device 600 according to one embodiment of the present invention. The contents explained in FIG. 1 are omitted. The pixel 120 is arranged in the display region 504. The pixel 120 has a semiconductor film 312. The first conductive film 344 overlaps the semiconductor film 312 and is arranged on the lower surface of the semiconductor film 312.

A scanning signal line drive circuit 510 (a scanning signal line drive circuit 508 is omitted) and an image signal line drive circuit 506 are arranged for controlling driving of the pixel 120 in addition to the display region 504. An example is shown in FIG. 2 in which the image signal line drive circuit 506 uses an IC chip. Here, an example is shown in which the scanning signal line drive circuit 510 and the image signal line drive circuit 506 are arranged above the layer 501 having the first conductive film. However, the present invention is not limited to this example. For example, a drive circuit formed above a substrate (semiconductor substrate or the like) which is different to the flexible substrate 502 may be arranged above a connector 512 such as the flexible substrate 502 or a flexible printed circuit (FPC). In addition, a part or all of the circuits included in the scanning signal line drive circuit 510 and the image signal line drive circuit 506 may be formed above a substrate which is different from the flexible substrate 502 and may be formed above the flexible substrate 502 or the connector 512. In addition, a drive circuit of a part of a drive circuit included in the image signal line drive circuit 506 may be formed directly above the flexible substrate 502. Furthermore, although not shown here, a display element and various kinds of semiconductor elements arranged within the pixel 120 are formed above the flexible substrate 502.

In addition, the display device 600 also includes a first wiring 206, a contact hole 208, a first terminal wiring 210, a first terminal 212, a second wiring 216, a contact hole 218, a second terminal wiring 220 and a second terminal 222. These are also arranged above the layer 501 having the first conductive film the same as the scanning signal line drive circuit 510.

The first conductive film 344 is electrically connected to the first wiring 206 which extends from outside of the display region 504. The first wiring 206 extends outside of the display region 504 and is electrically connected to the first terminal wiring 210 via the contact hole 208. The first terminal wiring 210 is exposed in the end part vicinity of the display device 600 and forms the first terminal 212. The first terminal 212 is connected to the connector 512.

In FIG. 2, in order to promote understanding, an example is shown in which a part of the first conductive film 344 is not electrically connected to the first wiring 206. Actually, one first wiring 206 is electrically connected to one first conductive film 344. By electrically connecting one first wiring 206 to one first conductive film 344, it is possible to independently apply a voltage to each of the first conductive films 344. Furthermore, a signal may be independently supplied to each of the first conductive films 344. In addition, different voltages or different signals may be supplied to each of the first conductive films 344. Since it is possible to detect a capacitance between each of the first conductive films 344 and the second conductive layer 505 by independently applying a voltage or a signal to each of the first conductive films 344, it is possible to specify the position where the display device 600 is pressed. That is, it is possible to specify the position where the display device 600 is pressed using a pressing sensor. In addition, by independently applying a voltage or a signal to each of the first conductive films 344, it is possible to stabilize the characteristics of TFTs arranged above the first conductive film 344. For example, by controlling the threshold value of each TFT, it is possible to make the currents flowing in the TFTs uniform. By making the currents flowing in the TFTs uniform, it is possible to provide a display device capable of displaying a clear image without unevenness in the image displayed on the display device.

The supply of signals to the pixel 120 is performed from an external circuit (not shown in the diagram) via the first terminal 212, the scanning signal line drive circuit 510 and the image signal line drive circuit 506. The first terminals 212 can be formed so as to be aligned along one side of the display device 600. As a result, by using a single connector 512, it is possible to supply voltages and signals independently to each of the display region 504 and the first conductive film 344.

An example is shown in which the arrangement of the pixels 120 is a stripe arrangement. Each of the pixels 120 may correspond to, for example, three subpixels 130, a subpixel 132 and a subpixel 134 (described later in FIG. 5). One pixel 102 (described later in FIG. 5) may be formed by three subpixels. Each subpixel is arranged with one display element such as a light emitting element. The color corresponding to a subpixel is determined by the characteristics of the light emitting element or a color filter arranged above the subpixel. In the present specification and the claims, each pixel 120 has one light emitting element, and at least one of the pixels 120 includes a plurality of subpixels that provide different colors. In addition, the pixel 120 is a minimum unit forming a part of an image to be reproduced in the display region 504. A subpixel included in the display region 504 is included in any one of the pixels.

In a stripe arrangement, three subpixels 130, subpixel 132 and subpixel 134 can be formed to provide mutually different colors, for example, a light emitting layer which emits the three primary colors of red, green and blue can be respectively arranged in the subpixel 130, the subpixel 132 and the subpixel 134. In addition, a full color display device can be provided by supplying an arbitrary voltage or current to each of the three subpixels.

Figure 3:
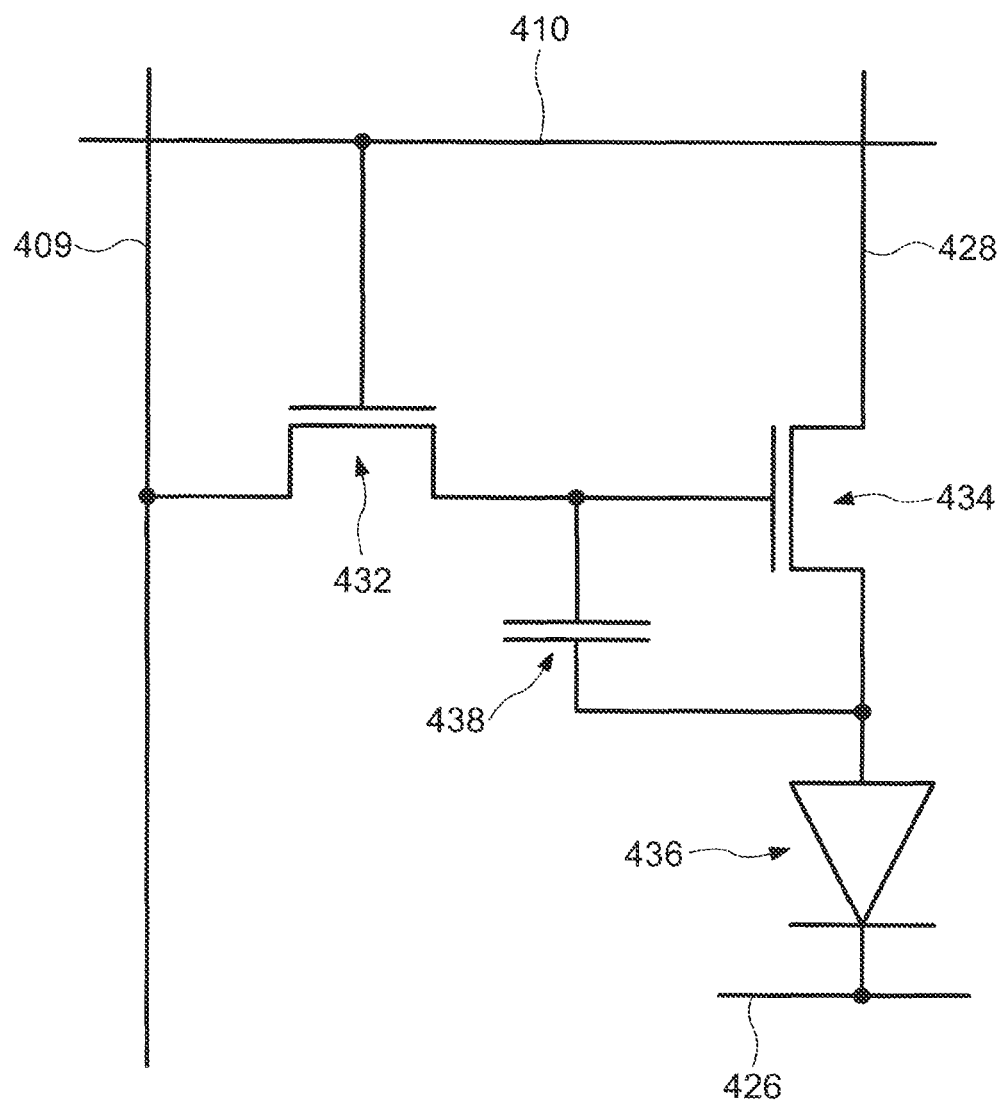
FIG. 3 is a circuit diagram of a pixel included in a display device related to one embodiment of the present invention.

A circuit diagram of a pixel circuit 430 of a pixel 120 included in a display device according to one embodiment of the present invention is shown in FIG. 3. Furthermore, the circuit structure of the pixel circuit 430 explained below is an example and is not limited thereto.

Each of a plurality of pixel circuits 430 includes a drive transistor 434, a selection transistor 432, a light emitting element 436 and a storage capacitor 438.

The drive transistor 434 is connected to the light emitting element 436. The drive transistor 434 is a transistor which controls the light emission luminosity of the light emitting element 436. In the drive transistor 434, a drain current is controlled by a gate-source voltage. The gate of the drive transistor 434 is connected to the drain of the selection transistor 432. The source of the drive transistor 434 is connected to a drive power supply line 428. The drain of the drive transistor 434 is connected to an anode of the light emitting element 436.

The selection transistor 432 is a transistor which controls a conduction state between an image signal line 409 and the gate of the drive transistor 434 by an ON/OFF operation. The gate of the selection transistor 432 is connected to a scanning signal line 410. The source of the selection transistor 432 is connected to the image signal line 409. The drain of the selection transistor 432 is connected to the gate of the drive transistor 434.

The anode of the light emitting element 436 is connected to the drain of the drive transistor 434. The cathode of the light emitting element 436 is connected to a reference power supply line 426. That is, the drive transistor 434 and the light emitting element 436 are connected in series between the drive power supply line 428 and the reference power supply line 426. The drive transistor 434 controls a current value flowing from the drive power supply line 428 to the reference power supply line 426 through the light emitting element 436.

The storage capacitor 438 is connected between the gate and drain of the drive transistor 434. The storage capacitor 438 holds the gate-drain voltage of the drive transistor 434.

Here, the reference power supply line 426 is arranged in common with the plurality of pixels 120. A constant potential is applied from the plurality of terminal electrodes 212 to the reference power supply line 426.

Figure 4:
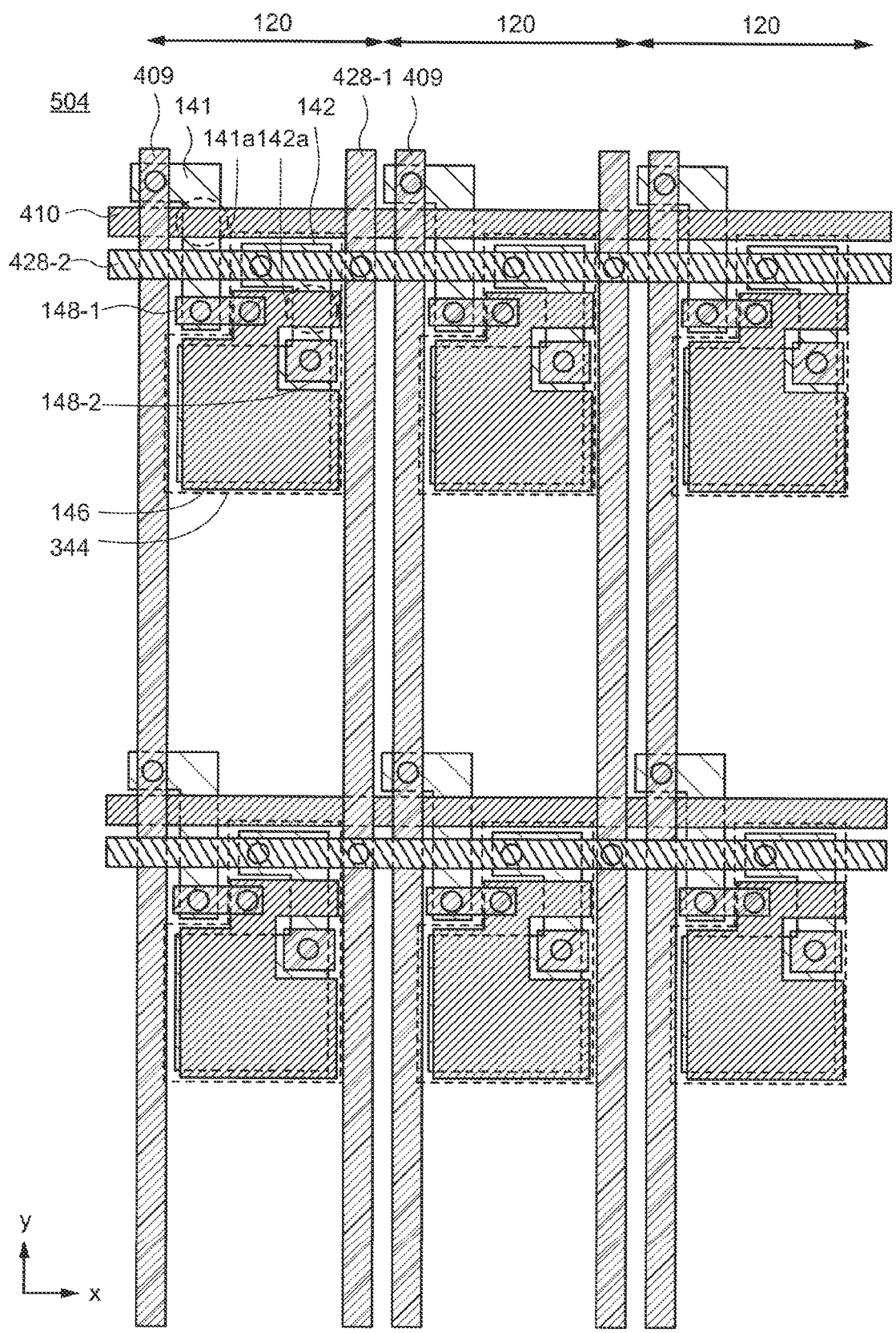
FIG. 4 is a schematic layout diagram of a pixel included in a display device related to one embodiment of the present invention.

A pixel 120 of 2 rows×3 columns is shown in FIG. 4. A signal line and a semiconductor film which form a pixel 120 are shown in FIG. 4 and an illustration of an insulating film is omitted.

In FIG. 4, the scanning signal line 410 and the drive power supply line 428-2 are arranged in one direction (x direction) of the display region 504. An image signal line 409 and a drive power supply line 428-1 are arranged in a direction (y direction) intersecting the one direction of the display region 504. In addition, the semiconductor film 141 and the semiconductor film 142 are arranged to overlap the scanning signal line 410 and the drive power supply line 428-2. A region 141a where the semiconductor film 141 and the scanning signal line 410 overlap functions as a channel region of the selection transistor 432 (shown in FIG. 4). A region 142a where the semiconductor film 142 and the gate electrode 146 overlap functions as a channel region of the drive transistor 434 (shown in FIG. 4).

One of the source region or the drain region of the semiconductor film 141 is connected to the image signal line 409. The other of the source region or the drain region of the semiconductor film 141 is connected to a source or drain electrode 148-1. In addition, one of a source region or drain region of the semiconductor film 142 is connected to the drive power supply line 428-2. The other of the source region or the drain region of the semiconductor film 142 is connected to a source or drain electrode 148-2. In addition, the semiconductor film 141 is connected to the gate electrode 146 via the source electrode or drain electrode 148-1.

Figure 5:
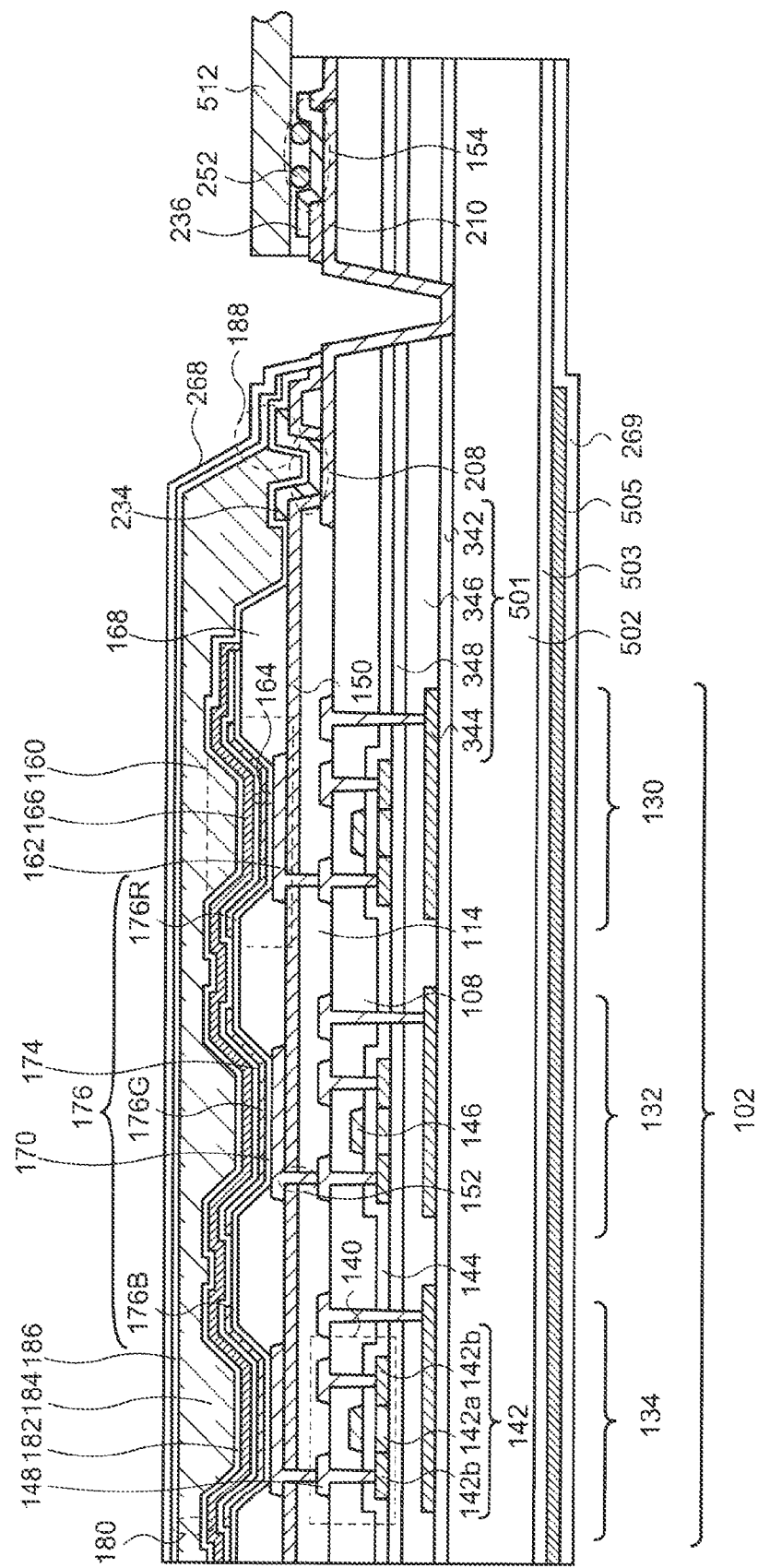
FIG. 5 is a schematic cross-sectional diagram of a display device related to one embodiment of the present invention.

FIG. 5 is a schematic cross-sectional view of a display device according to one embodiment of the present invention.

An organic insulating film 503 is arranged on the lower side of the flexible substrate 502. A second conductive layer 505 is arranged below the organic insulating film 503. Although FIG. 5 shows an example in which the second conductive layer 505 is arranged on a part of the lower side of the display device, the present invention is not limited to this example. The second conductive layer 505 may also be arranged so as to overlap at least the display region 504. In addition, the second conductive layer 505 may also be arranged on the entire surface of the lower side of the display device.

A layer 501 including a first conductive film is arranged on the upper side of the flexible substrate 502. The layer 501 having the first conductive film is formed from a first inorganic insulating film 342, a first conductive film 344, a second inorganic insulating film 346 and a third inorganic insulating film 348. The first inorganic insulating film 342, the second inorganic insulating film 346 and the third inorganic insulating film 348 are base films of the display device 600.

A transistor 140 is arranged on the upper side of the base film 106. The transistor 140 includes a semiconductor film 142, a gate insulating film 144, a gate electrode 146 and a source electrode or a drain electrode 148 and the like. The gate electrode 146 overlaps the semiconductor film 142 interposed by the gate insulating film 144 in between. A region overlapping the semiconductor film 142 and the gate electrode 146 is a channel region 142a of the semiconductor film 142. The semiconductor film 142 may also have a source and drain region 142b which sandwiches the channel region 142a. An interlayer film 108 can be arranged above the gate electrode 146. The source electrode or drain electrode 148 is connected to the source and drain regions 142b in an opening arranged in the interlayer film 108 and the gate insulating film 144.

A first terminal wiring 210 is arranged above the interlayer film 108. The first terminal wiring 210 may be arranged in the same layer as the source electrode or drain electrode 148. Although not shown in the diagram, the first terminal wiring 210 may also be arranged in the same layer as the gate electrode 146.

The source electrode or drain electrode 148 is connected to the first conductive film 344 in an opening arranged in the interlayer film 108, the gate insulating film 144 and the first inorganic insulating film. Furthermore, an opening may be arranged in the gate insulating film 144 and the first inorganic insulating film so that the first conductive film 344 may be connected to the gate electrode 146.

In FIG. 5, the transistor 140 is shown as a top-gate type transistor. However, the structure of the transistor 140 is not limited and a bottom-gate type transistor, a multi-gate type transistor having a plurality of gate electrodes 146 and a dual-gate type transistor having a structure in which the semiconductor film 142 is sandwiched between two gate electrodes 146 may also be used. In addition, FIG. 5 shows an example in which one pixel 102 includes three subpixels, a subpixel 130, a subpixel 132 and a subpixel 134. In addition, FIG. 5 shows an example in which one transistor 140 is arranged for each subpixel 130, each subpixel 132 and each subpixel 134. Each subpixel 130, each subpixel 132 and each subpixel 134 may further have a semiconductor element such as a plurality of transistors or a capacitor.

A planarization film 114 is arranged over the transistor 140. The planarization film 114 has a function to absorb unevenness caused by the transistor 140 and other semiconductor elements and provide a flat surface. An organic compound material selected from acrylic and polyimide and the like having excellent film surface flatness can be used as the planarization film 114.

The inorganic insulating film 150 may be formed above the planarization film 114. The inorganic insulating film 150 has a function for protecting a semiconductor element such as the transistor 140. In addition, a capacitor may be formed between the first electrode 162 which is described later and an electrode (not shown the diagram) formed to sandwich the inorganic insulating film 150.

A plurality of openings are arranged in the planarization film 114 and the inorganic insulating film 150. One of the plurality of openings is the contact hole 152. The contact hole 152 is used for an electrical connection between the first electrode 162 of the light emitting element 160 which is described later and the source electrode or drain electrode 148. One of the plurality of openings is the contact hole 208. The contact hole 208 is used for an electrical connection between the first wiring 206 and the first terminal wiring 210. One of the plurality of openings is the opening 154. The opening 154 is arranged to expose a part of the first terminal wiring 210. The first terminal wiring 210 which is exposed at the opening 154 is connected to the connector 512 by an anisotropic conductive film 252 for example.

A light emitting element 160 is formed over the planarization film 114 and the inorganic insulating film 150. The light emitting element 160 includes a first electrode (pixel electrode) 162, a functional layer 164 and a second electrode (counter electrode) 166. More specifically, the first electrode 162 covers the contact hole 152. In addition, the first electrode 162 is electrically connected to the source electrode or drain electrode 148. In this way, a current is supplied to the light emitting element 160 via the transistor 140. A partition wall 168 is arranged to cover an end part of the first electrode 162. By covering the end part of the first electrode 162 with the partition wall 168, it is possible to prevent disconnection of the functional layer 164 and the second electrode 166 arranged above. The functional layer 164 is arranged to cover the first electrode 162 and the partition wall 168. A second electrode 166 is formed above the functional layer 164. Carriers are injected into the functional layer 164 from the first electrode 162 and the second electrode 166, and carrier recombination takes place in the functional layer 164. In this way, the light emitting molecules in the functional layer 164 become an excited state. Light emission is obtained through a process of relaxing the excited state light emitting molecules to a ground state. Therefore, a region where the first electrode 162 and the functional layer 164 are in contact is a light emitting region in each of the subpixels 130, each subpixel 132 and each subpixel 134.

It is possible to appropriately select the structure of the functional layer 164. The functional layer 164 may be combined with, for example, a carrier injection layer, a carrier transport layer, a light emitting layer, a carrier blocking layer and an exciton blocking layer. In FIG. 5, an example is shown in which the functional layer 164 has a layer 170, a layer 176 and a layer 174. In this case, for example, the layer 170 can be a carrier (hole) injection and a transport layer, the layer 176 can be a light emitting layer and the layer 174 can be a carrier (electron) injection and a transport layer. The layer 176 which is a light emitting layer can be formed including different materials for each subpixel 130, each subpixel 132 and each subpixel 134. In this case, the layers 170 and 174 are formed across and over each subpixel 130, each subpixel 132, each subpixel 134 and the partition wall 168 so as to be shared by each subpixel 130, each subpixel 132 and each subpixel 134. By appropriately selecting the material used for the layer 176, it is possible to obtain different light emitting colors for each of the subpixels 130, the subpixels 132 and the subpixels 134. Alternatively, the structure of the layer 174 may be the same between each subpixel 130, each subpixel 132 and each subpixel 134. In this case, the layer 174 may also be formed across and over each subpixel 130, each subpixel 132, each subpixel 134 and the partition wall 168 so as to be shared by each subpixel 130, each subpixel 132 and each subpixel 134. In this type of structure, the same light emitting color is output from the layer 176 of each subpixel 130, each subpixel 132 and each subpixel 134. For example, the layer 176 may be formed to emit white light, and various colors (for example, red, green, and blue) may be extracted from each subpixel 130, each subpixel 132 and each subpixel 134 using a color filter.

Furthermore, the display device 600 may include a connection electrode 234 and a connection electrode 236. The connection electrode 234 and the connection electrode 236 cover the contact hole 208 and the opening 154 and are in contact with the first terminal wiring 210. The connection electrode 234 and the connection electrode 236 may exist in the same layer as the first electrode 162. By forming the connection electrode 234 and the connection electrode 236, it is possible to reduce damage to the first terminal wiring 210 in the manufacturing process of the display device 600 and realize an electrical connection with low contact resistance.

A sealing film (passivation film) 180 is arranged above the light emitting element 160. The sealing film 180 has a function to prevent impurities (water, oxygen, etc.) from entering the light emitting element 160 and the transistor 140 from the outside. As is shown in FIG. 5, the sealing film 180 may include a layer 182, a layer 184 and a layer 186. It is possible to use an inorganic film containing an inorganic compound in the layer 182 (first inorganic film) and the layer 186 (second inorganic film). On the other hand, it is possible to use a film 184 (organic film) including an organic compound selected from acrylic or polyimide and the like in the layer 184 between the first inorganic film 182 and the second inorganic film 186. It is possible to form the organic film 184 to absorb irregularities caused by the light emitting element 160 and the partition wall 168 and provide a flat surface. Therefore, it is possible to make the thickness of the organic film 184 relatively large.

Furthermore, it is preferred that the first inorganic film 182 and the second inorganic film 186 are formed to cover at least the display region 504. In addition, the first inorganic film 182 and the second inorganic film 186 are preferably formed to not overlap the contact hole 208 and the opening 154. In this way, it is possible to obtain an electrical connection with low contact resistance between the first terminal wiring 210 and the connector 512. In addition, electrical connection with low contact resistance can be made between the first terminal wiring 210 and the first wiring 206. Furthermore, it is preferred that the first inorganic film 182 and the second inorganic film 186 are in direct contact with each other in the periphery of the display region 504 (see the region surrounded by a circle 188). In this way, the organic film 184 having high hydrophilicity can be sealed using the first inorganic film 182 and the second inorganic film 186 compared with the first inorganic film 182 and the second inorganic film 186. Therefore, it is possible to more effectively prevent impurities from entering from outside and the diffusion of impurities into the display region 504.

A cover film 268 is arranged over the second inorganic film 186. A region which opens the first interlayer film 108, the gate insulating film 144, the first inorganic insulating film 342, the second inorganic insulating film 346 and the third inorganic insulating film 348, and a region where the first terminal wiring 210 is arranged so as to contact with the flexible substrate 502 are regions in which the display device 600 can bend. The cover film 268 protects the surface of the display device 600 up to the region where it is possible to achieve this bend. In addition, a cover film 269 is arranged under the second conductive layer 505. The cover film 269 protects the second conductive layer 505 from being damaged and also protects the rear surface of the display device 600. Furthermore, the cover film 268 and the cover film 269 are not absolutely necessary. In addition, if the cover film 268 is sufficiently flexible with respect to bending, then the cover film 268 may extend to a region where the cover film 268 can be bent.

Figure 6:
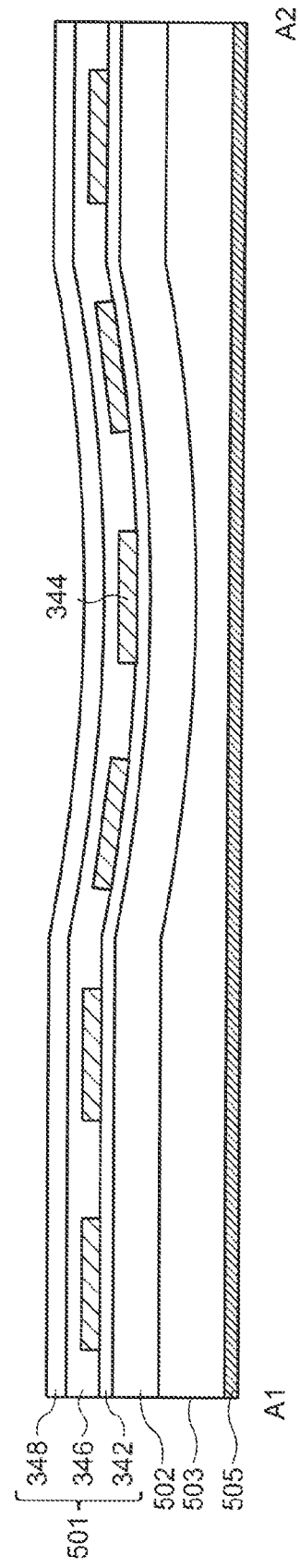
FIG. 6 is a schematic cross-sectional diagram showing an example when a display device related to one embodiment of the present invention is pressed.

FIG. 6 is a schematic cross-sectional diagram showing an example when the display device according to one embodiment of the present invention is pressed. The diagram is a cross-sectional view between A1 and A2 shown in FIG. 2. Furthermore, layers above the layer 501 having the first conductive film are omitted.

The layer 501 having a first conductive film is formed from a first inorganic insulating film 342, a first conductive film 344, a second inorganic insulating film 346 and a third inorganic insulating film 348.

When the display device is pressed, the thicknesses of the first inorganic insulating film 342, the first conductive film 344, the second inorganic insulating film 346, and the third inorganic insulating film 348 hardly changes. On the other hand, the organic insulating film 503 is compressed. The organic insulating film 503 is more easily compressed than the first inorganic insulating film 342, the first conductive film 344, the second inorganic insulating film 346 and the third inorganic insulating film 348. That is, the organic insulating film 503 has a smaller elastic modulus than the first inorganic insulating film 342, the first conductive film 344, the second inorganic insulating film 346 and the third inorganic insulating film 348.

The ease of compression of each material such as the organic insulating film 503, the first inorganic insulating film 342, the first conductive film 344, the second inorganic insulating film 346 and the third inorganic insulating film 348 can be judged from the Young's modulus of the material for example. That is, the Young's modulus of the organic insulating film 503 is smaller than that of the first inorganic insulating film 342, the first conductive film 344, the second inorganic insulating film 346 and the third inorganic insulating film 348.

For example, the Young's modulus can be calculated statically or by a free resonance method. The static calculation method is a method in which a static load such as tension or compression, bending, or torsion is applied to a test piece of an object to be evaluated and the stress and strain are measured to determine the elastic modulus. In the free resonance method, free vibration or forced vibration is caused in a sample of an object to be evaluated and its intrinsic vibration is measured to determine the elastic modulus.

An equation for calculating the Young's modulus is, for example, equation 1. In equation 1, E is the Young's modulus, L, b, d and g are each the length (m), width (m), thickness (m) and mass (g) of the sample piece, and A is the resonance frequency (Hz).

$$E = 0.96535 \times 10^{-8} \times \left(\frac{L}{d}\right)^3 \times \frac{g}{b} \times \lambda^3 \tag{1}$$

Figure 7:
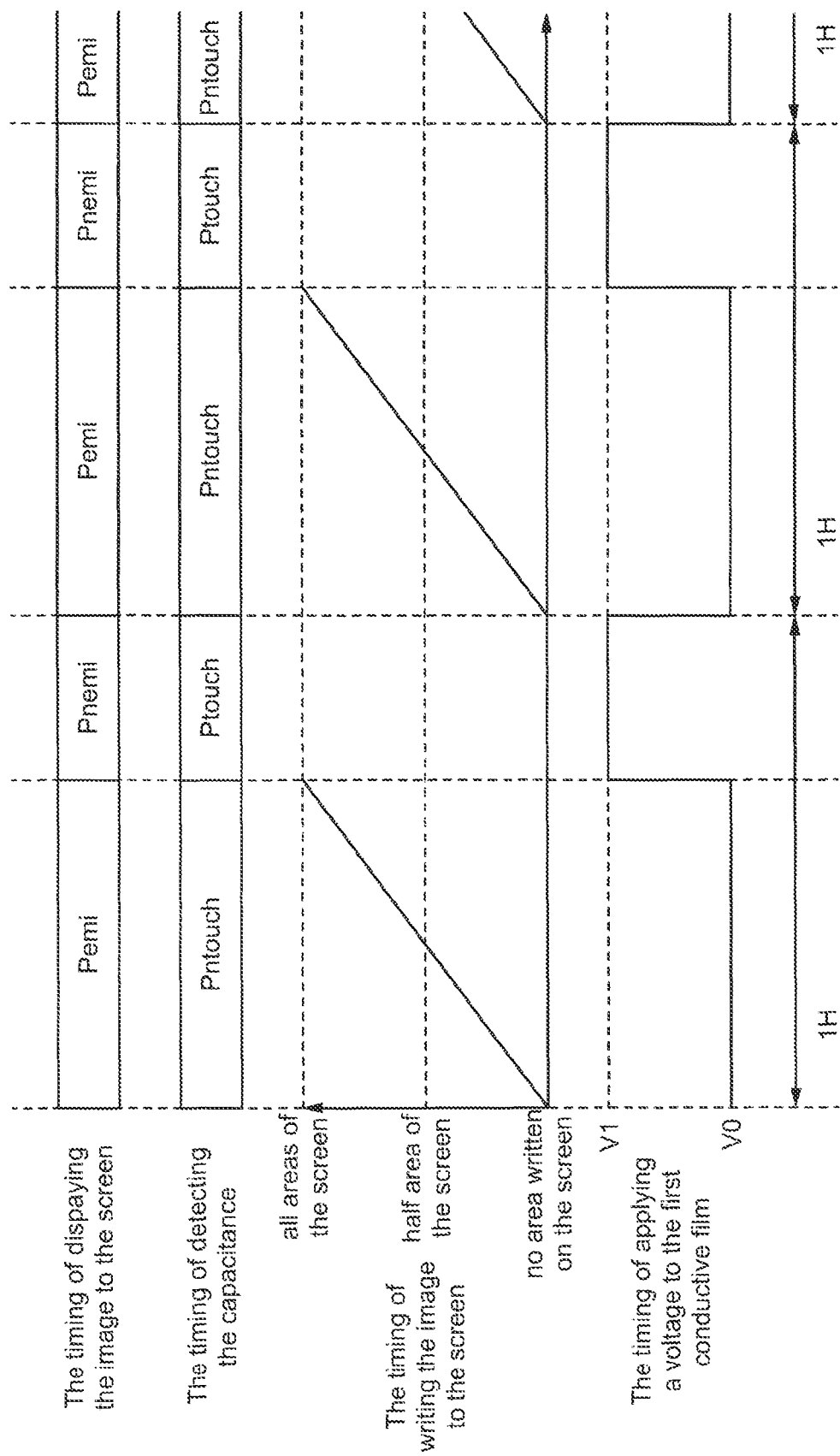
FIG. 7 is a timing flowchart of a display device related to one embodiment of the present invention.

FIG. 7 is a timing chart of a display device according to one embodiment of the present invention.

The horizontal axis in FIG. 7 is time. 1H shown on the horizontal axis includes the time for displaying an image by writing the data for one screen on each of the pixels 120, and the time for detecting capacitance when a finger presses the display device. For example, 1H is ⅟₆₀ of a second. A period (Pemi) during which an image is written and displayed is a period (Pntouch) in which capacitance detection is not carried out. A period (Pnemi) in which no image is written or displayed is a period (Ptouch) in which capacitance detection is carried out.

In Pntouch, a voltage which is applied to the first conductive film 344 is V0. The voltage applied to the first conductive film 344 shown in FIG. 2 is V0. Referring to FIG. 2, V0 is applied to the first conductive film 344 from an external circuit (not shown in the diagram) via the first terminal 212. V0 is, for example, 0V. Furthermore, although V0 is shown as 0V as an example, the present invention is not limited to 0V. For example, the applied voltage may be a constant voltage other than 0V, and V0 may vary with time. In addition, the first conductive film 344 may be a signal that varies with time.

In Ptouch, a voltage which is applied to the first conductive film 344 is V1. V1 is a value larger than V0. Although not shown in the diagram, it is preferred that the voltage applied to the second conductive layer 505 is a constant voltage in all periods. The constant voltage is, for example, 0V or a GND potential.

In the display device 600 according to one embodiment of the present invention, a pressure sensor can detect a change in the capacitance value between each of a plurality of first conductive films 344 and the second conductive layer 505 using the timing chart shown in FIG. 7. In addition, it is possible to specify the region pressed by a finger.

An example of a manufacturing process of a display device having a pressure sensor according to one embodiment of the present invention is explained using FIG. 8 to FIG. 11. Furthermore, an explanation of structures similar to those in FIG. 1 to FIG. 7 may be omitted.

Figure 8:
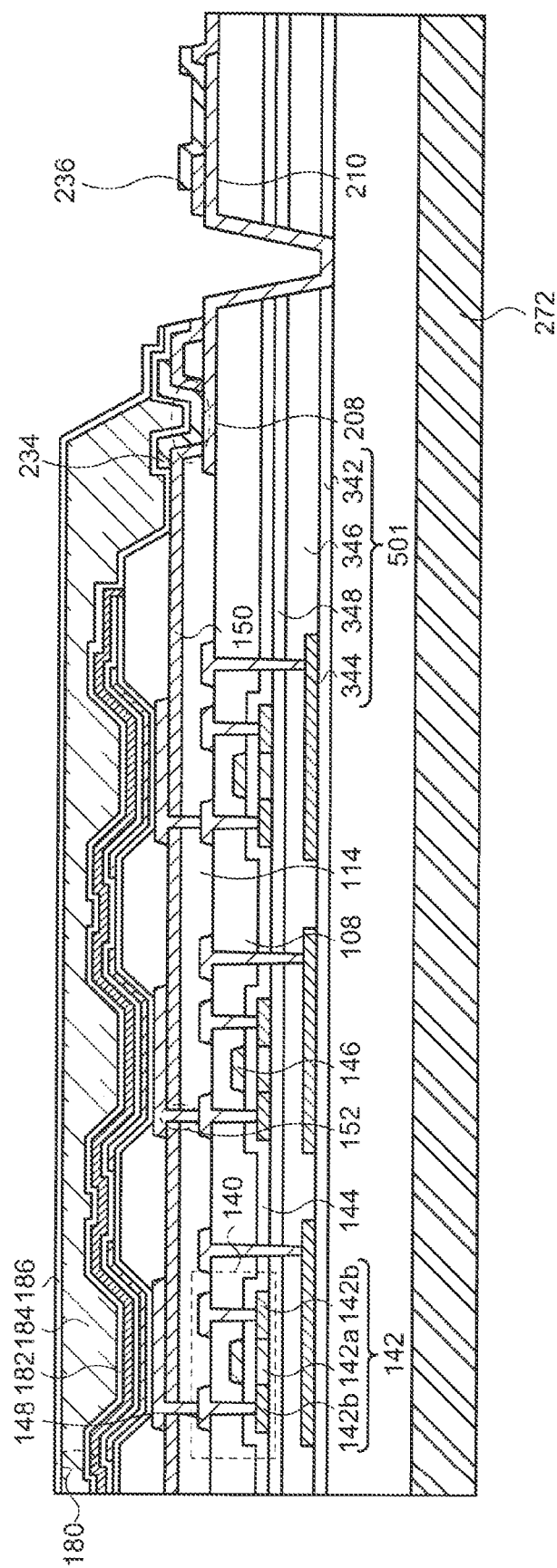
FIG. 8 is a schematic cross-sectional diagram showing an example of a manufacturing process of a display device related to one embodiment of the present invention.

A display device having a pressing sensor according to one embodiment of the present invention shown in FIG. 8 shows an example of a display device having an EL display panel. Since the manufacturing process of a general EL display panel is a well-known technique, an explanation is omitted.

Furthermore, the display device having the pressure sensor according to one embodiment of the present invention is different when compared with a general EL display panel in that a base film is formed from the first inorganic insulating film 342, the second inorganic insulating film 346 and a third inorganic insulating film 348. In addition, the display device having the pressure sensor according to one embodiment of the present invention is different when compared with a general EL display panel in that the first conductive film 344 is arranged between the first inorganic insulating film 342 and the second inorganic insulating film 346. That is, a display device having a pressure sensor according to one embodiment of the present invention is different from a general EL display panel in that it includes a layer 501 having a first conductive film.

The first inorganic insulating film 342, the second inorganic insulating film 346 and the third inorganic insulating film 348 can be formed using a device which is used for manufacturing a general display device. For example, it is preferred that the first inorganic insulating film 342, the second inorganic insulating film 346 and the third inorganic insulating film 348 include an inorganic insulating material such as silicon nitride, silicon oxide, silicon nitride oxide or silicon oxynitride and the like. In addition, the inorganic insulating film can be formed by applying chemical vapor deposition (CVD) or sputtering. The inorganic insulating film may have a single layer or a stacked layer structure.

In addition, the first conductive film 344 can also be formed using a device which is used for manufacturing a general display device. For example, the first conductive film 344 can be formed using a metal such as titanium, aluminum, copper, molybdenum, tungsten, tantalum, or an alloy thereof. The first conductive film 344 may have a single layer or a stacked layer structure. In addition, the first conductive film 344 can be formed using a sputtering method or a CVD method.

As is shown in FIG. 8, the display device having a pressure sensor according to one embodiment of the present invention is formed up to a second inorganic film 186 is formed above a flexible substrate 502 supported on a first support substrate 272. The formed member is called a flexible substrate.

Figure 9:
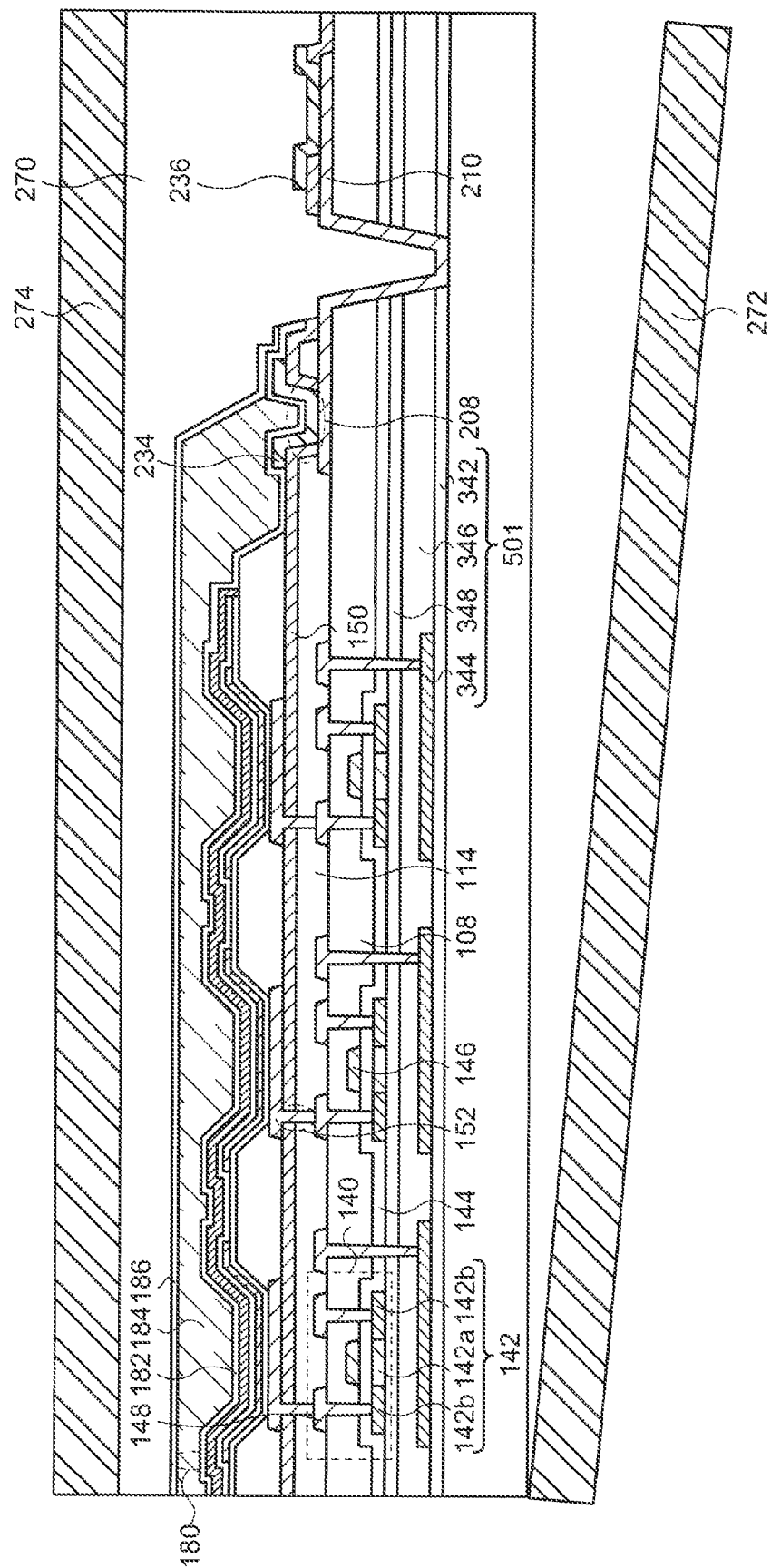
FIG. 9 is a schematic cross-sectional diagram showing an example of a manufacturing process of a display device related to one embodiment of the present invention.

Next, as is shown in FIG. 9, the organic insulating film 270 is coated on the second inorganic film 186. A second supporting substrate 274 is arranged above the organic insulating film 270 in order to support the flexible substrate. Furthermore, the first supporting substrate 272 is peeled off.

Figure 10:
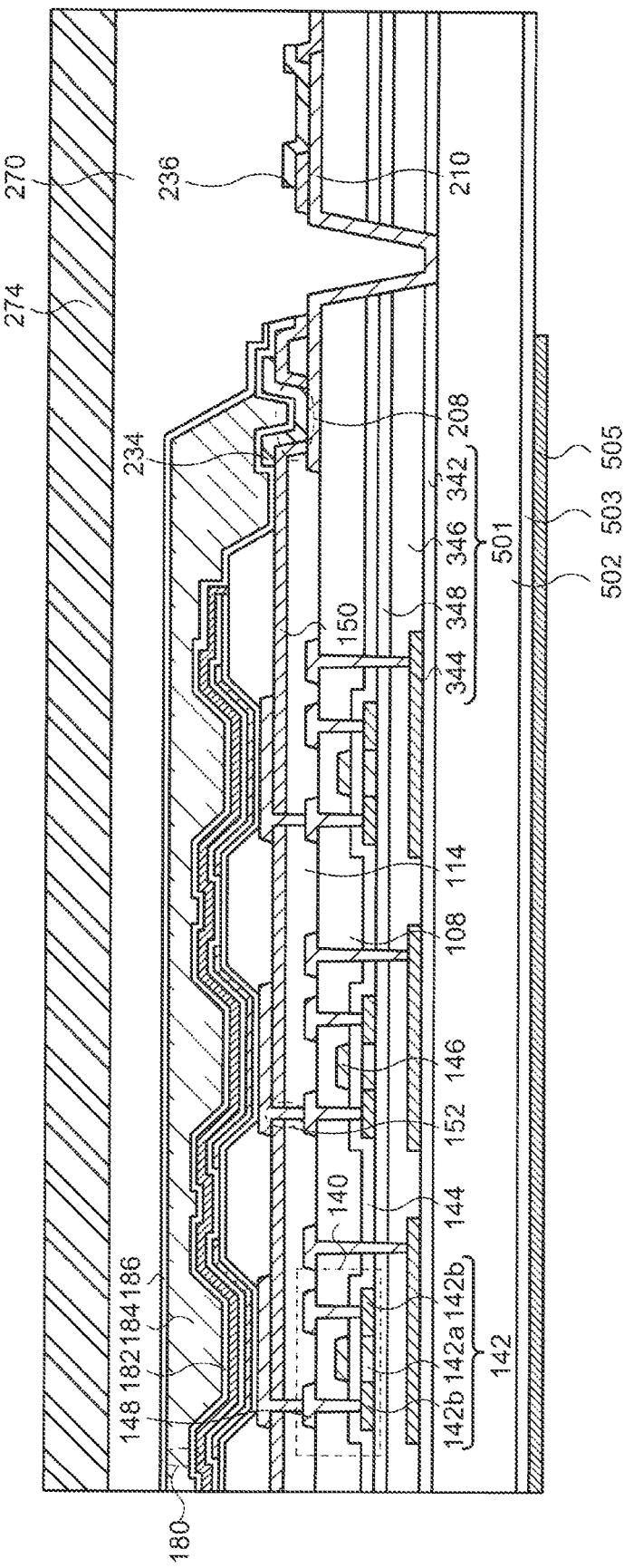
FIG. 10 is a schematic cross-sectional diagram showing an example of a manufacturing process of a display device related to one embodiment of the present invention.

Next, as is shown in FIG. 10, an organic insulating film 503 is formed on the lower side of the flexible substrate 502. The organic insulating film 503 is preferred to be a material having elasticity smaller than the flexible substrate 502, the first inorganic insulating film 342, the second inorganic insulating film 346 and the third inorganic insulating film 348. For example, it is preferred to be made of polyethylene terephthalate (PET), polyethylene naphthalate (PEN), polyimide (PI) or polyetherimide (PEI). The organic insulating film 503 can be formed by applying a wet film formation method such as a printing method, an inkjet method, a spin coating method or a dip coating method and the like.

Next, a second conductive film 505 is formed on the lower side of the organic insulating film 503. The second conductive film 505 can be formed using the same material and the same method as the first conductive film 344. Furthermore, when the display device 600 is a transmissive display device for example, a transparent conductive material such as ITO (Indium Tin Oxide) can be used for the second conductive film 505.

Figure 11:
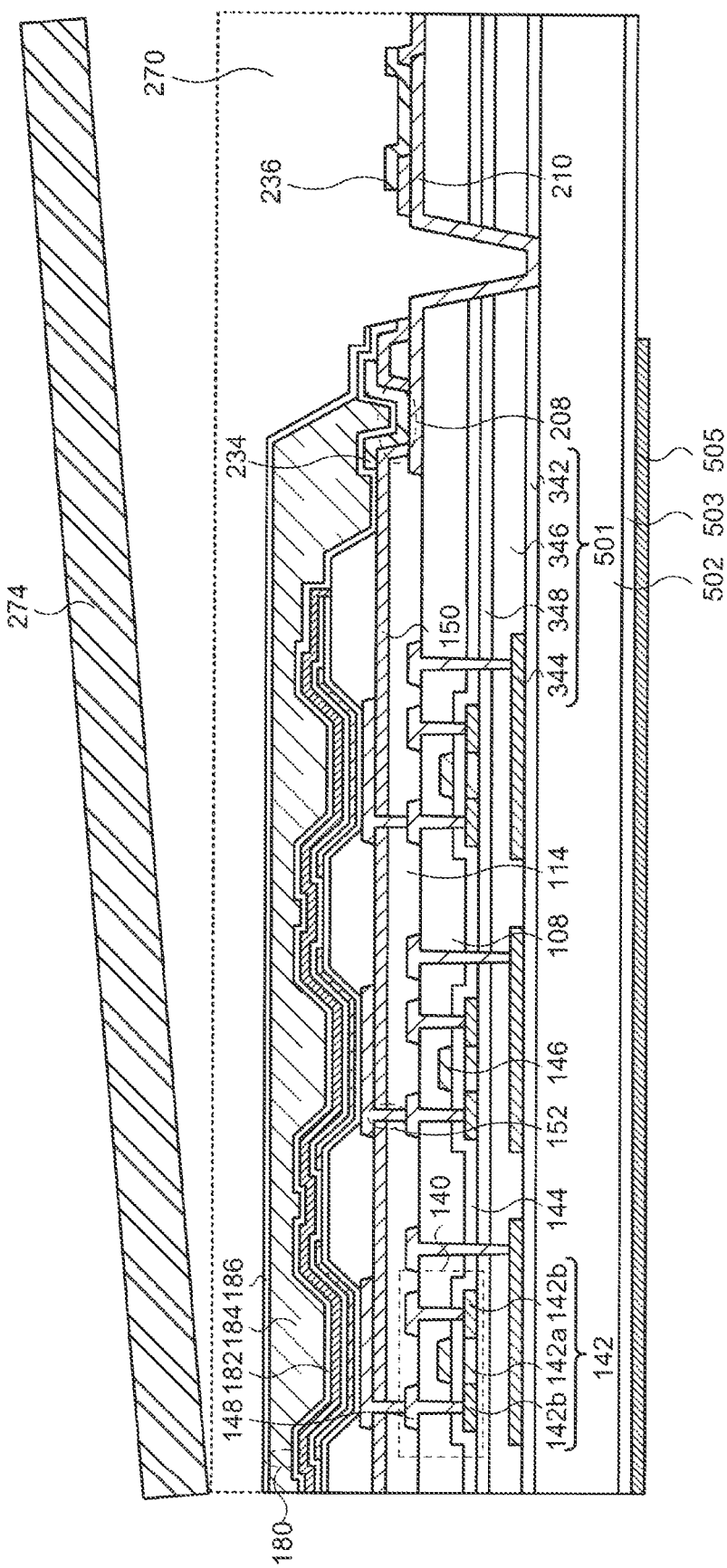
FIG. 11 is a schematic cross-sectional diagram showing an example of a manufacturing process of a display device related to one embodiment of the present invention.

Next, as is shown in FIG. 11, the second supporting substrate 274 is peeled off. Next, the organic insulating film 270 is peeled off. Finally, by arranging the cover film 268 and the cover film 269, it is possible to manufacture a display device arranged with a pressing sensor according to one embodiment of the present invention.

Figure 12:
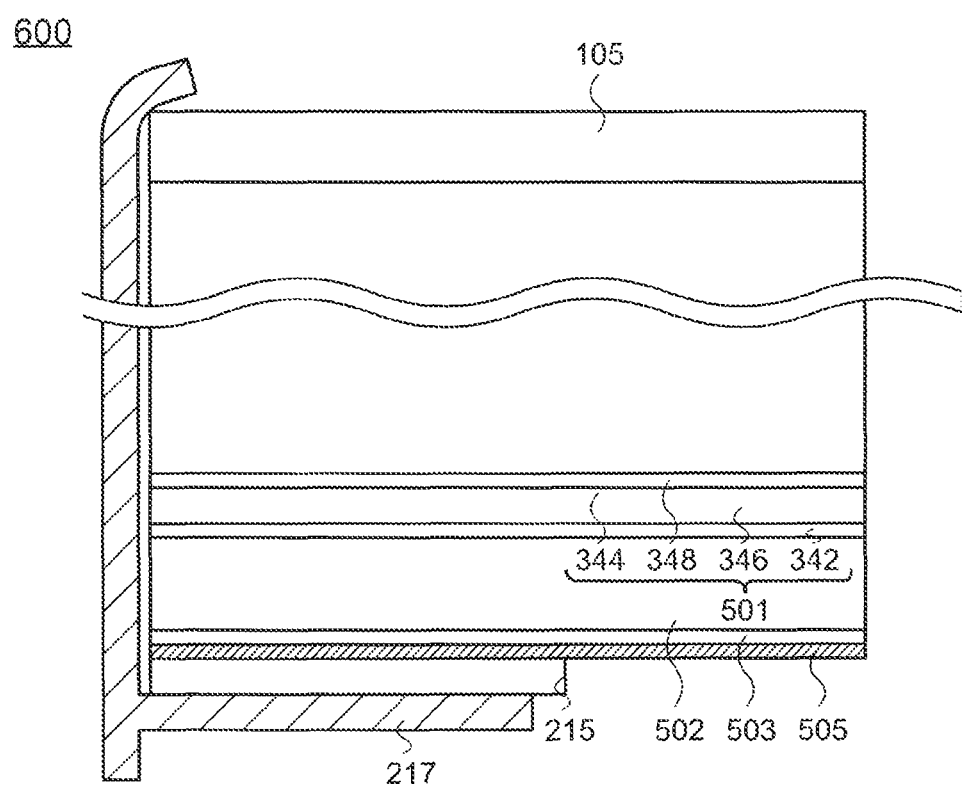
FIG. 12 is a schematic cross-sectional diagram of a display device related to one embodiment of the present invention.

FIG. 12 is a schematic cross-sectional diagram of a display device having a pressure sensor according to one embodiment of the present invention. The display device 600 has a structure in which it is sandwiched between metal members 217 of a casing. Apart from the display device 600 having a structure in which it is sandwiched between metal members 217 of a casing, the contents explained using FIG. 1 to FIG. 11 are the same. Therefore, an explanation the same as that in FIG. 1 to FIG. 11 is omitted here. The display device 600 may further be arranged with a substrate 105 above the cover film 268. By using the substrate 105, the display device 600 can be supported by the substrate 105 and it is possible to prevent the display device 600 from being damaged by an impact. The second conductive layer 505 is electrically connected by the metal member 217 of the casing. Generally, since the metal member 217 of the casing is connected to GND, GND is supplied to the second conductive layer 505.

Using the structure described above, it is possible to supply a constant voltage to the second conductive layer 505 in the display device according to one embodiment of the present invention.

In addition, by adding a first conductive layer, an insulating film and a second conductive layer from the structure of a known display device through the manufacturing process as described above to the display device according to one embodiment of the present invention, it is possible to relatively easily provide a display device having a pressing sensor. In addition, since a display device having a pressure sensor can be manufactured using a known display device without using a special manufacturing device, it is possible to provide a multi-functional display device with reduced manufacturing costs.

By providing the display device according to the embodiment of the present invention with structure described above, it is possible to detect a capacitance when the display device is pressed. In addition, by detecting the capacitance, it is possible to specify the area where the display device is pressed. That is, it is possible to specify the area of the display device which is pressed by the pressing sensor included in the display device. Furthermore, by adding a first conductive layer, an insulating film and a second conductive layer from the structure of a known display device, it is possible to relatively easily provide a display device having a pressing sensor.

Second Embodiment

In the present embodiment, another example of a display device having a pressure sensor according to one embodiment of the present invention is explained. Furthermore, explanations regarding the same structure as in the first embodiment may be omitted.

Figure 13:
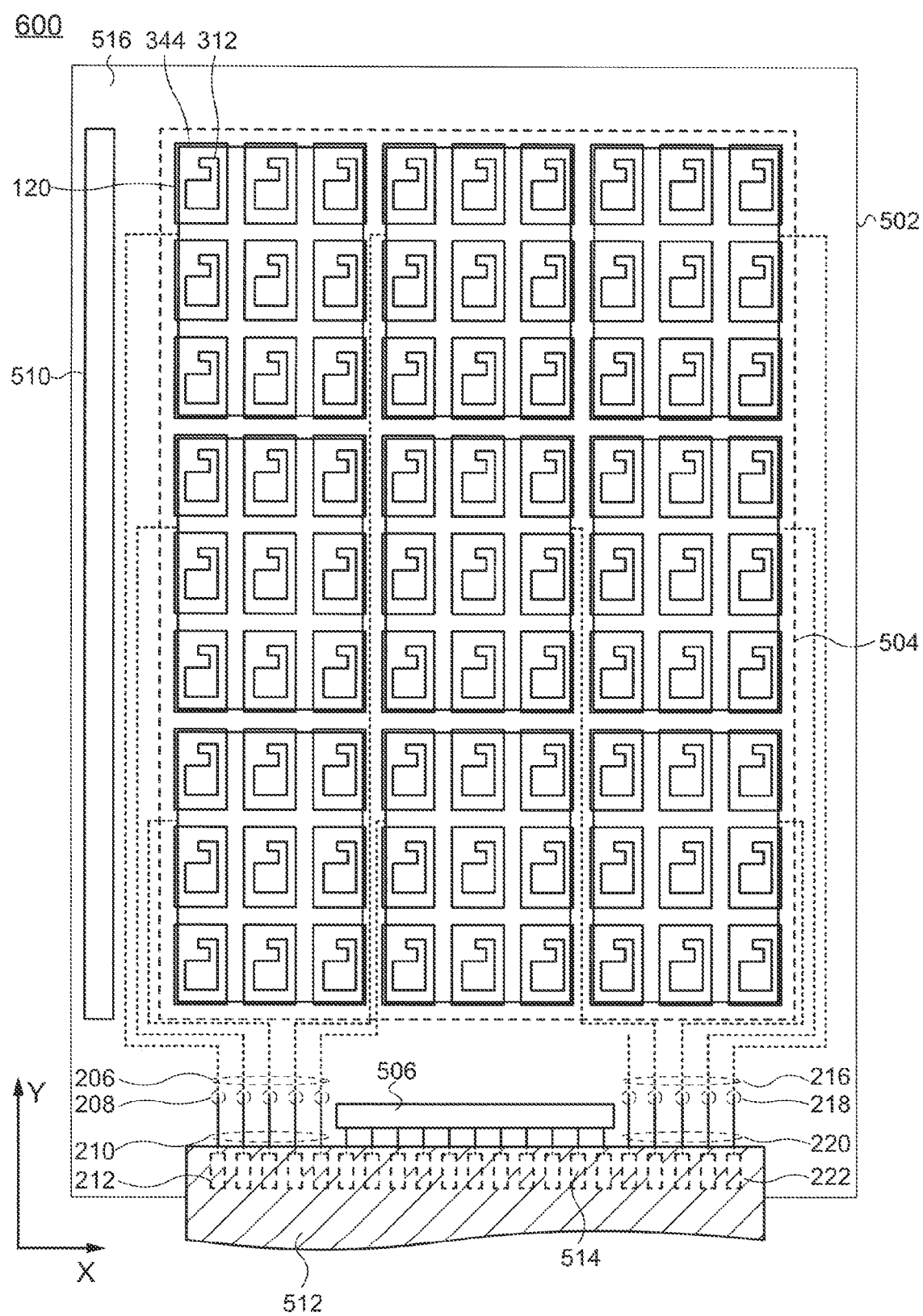
FIG. 13 is a schematic planar view diagram of a display device related to one embodiment of the present invention.

FIG. 13 is a schematic planar diagram of a display device having a pressure sensor according to one embodiment of the present invention. FIG. 13 is different from FIG. 2 in that the first conductive film 344 is arranged to overlap a plurality of pixels. Except the first conductive film 344 being arranged to overlap with a plurality of pixels FIG. 13 and FIG. 2 are the same. Therefore, the same explanation as in FIG. 2 is omitted here. Furthermore, the plurality of pixels over which the first conductive film 344 overlaps may be, for example, pixels corresponding to the same color or pixels corresponding to different colors. The first conductive film 344 is electrically connected to the second wiring 216 extending from outside of the display region 504. The second wiring 216 extends outside the display region 504 and is electrically connected to the first terminal wiring 220 via the contact hole 218. The second terminal wiring 220 is exposed in the vicinity of an end part of the display device 600 and forms the second terminal 222. The first terminal 222 is connected to the connector 512. Therefore, a voltage or a signal applied to the first conductive film 344 is provided from an external circuit to the first conductive film 344 via the second terminal 222. Furthermore, the second wiring 216 may be the first wiring 206. The contact hole 218 may be the contact hole 208. The second terminal wiring 220 may be the first terminal wiring 210. The second terminal 222 may be the first terminal wiring 210. The second terminal 222 may be the first terminal 212. The tip of a finger which applies pressure to the display device or the tip of a pointing device such as a stylus pen is significantly larger than the size of each pixel. Therefore, as is shown in FIG. 13, even if the first conductive film 344 is arranged to overlap with a plurality of pixels, it is possible to sufficiently detect the coordinates where pressure is applied.

Figure 14:
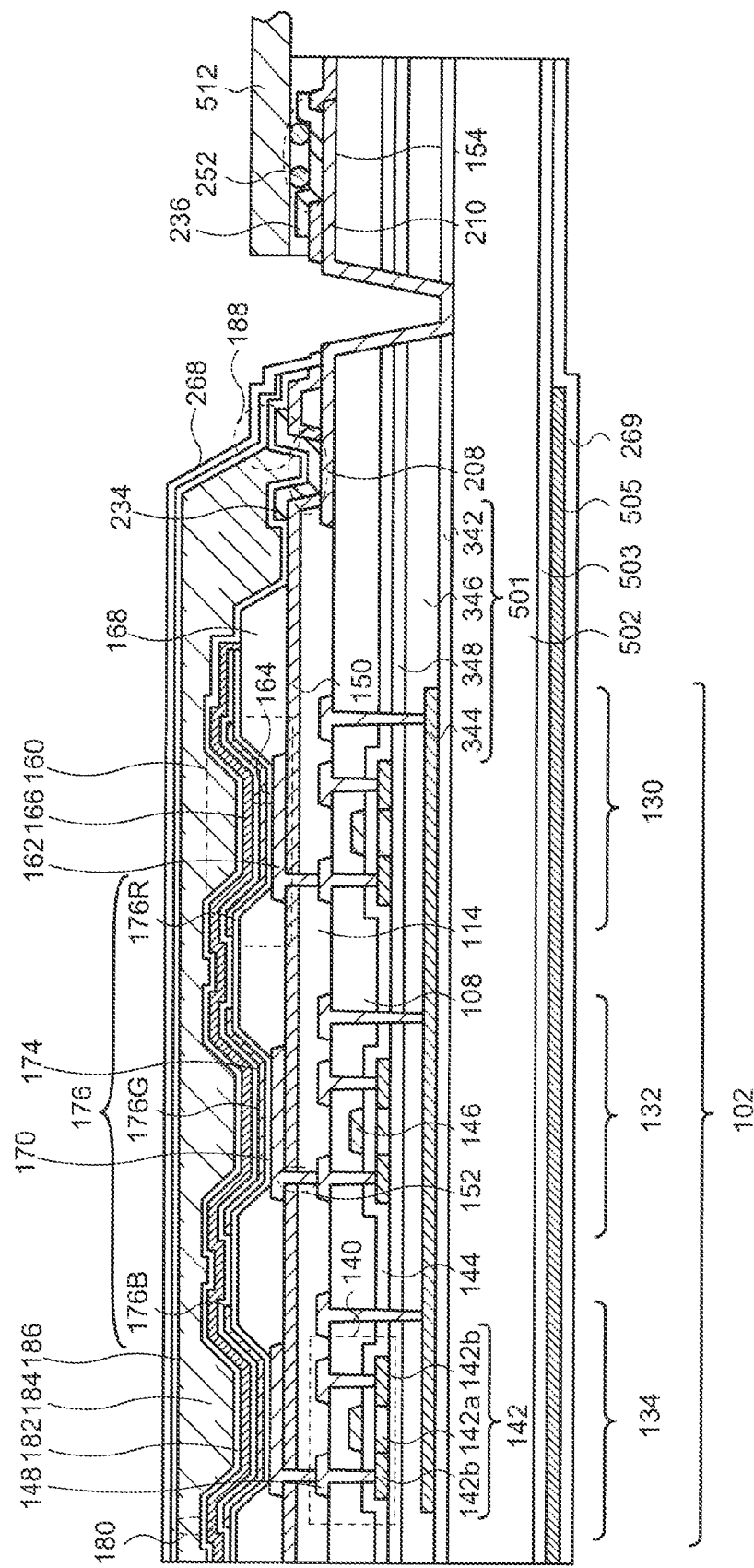
FIG. 14 is a schematic cross-sectional diagram of a display device related to one embodiment of the present invention.

FIG. 14 is a schematic cross-sectional diagram of a display device having a pressure sensor according to one embodiment of the present invention. FIG. 14 is a diagram schematically showing a cross section of FIG. 13. When FIG. 14 is compared with FIG. 5, the first conductive film 344 is arranged to overlap with a plurality of pixels. Here, an example is shown in which the first conductive film 344 overlaps three subpixels, the subpixel 134, subpixel 132 and the subpixel 130. When FIG. 14 is compared with FIG. 5, they are the same except the first conductive film 344 being arranged to overlap a plurality of pixels. Therefore, the same explanation as in FIG. 5 is omitted here.

Furthermore, FIG. 14 shows an example in which the first conductive film 344 is electrically connected to the wiring used for the source electrode or the drain electrode 148 at three places. The electrical connection between the first conductive film 344 and the wiring used for the source electrode or the drain electrode 148 is not limited to the example shown in FIG. 14. For example, the electrical connection between the first conductive film 344 and the wiring used for the source electrode or the drain electrode 148 may be at one place or four or more places. The electrical connections between the first conductive film 344 and the wiring used for the source electrode or drain electrode 148 can be a plurality of connections whereby it is possible to reduce the resistance between the first conductive film 344 and the wiring used for source electrode or drain electrode 148. Therefore, it is possible to make the potential of a signal shared by the first conductive layer 344 uniform. On the other hand, since the electrical connections between the first conductive film 344 and the wiring used for the source electrode or drain electrode 148 are few, it is possible to reduce the number of holes to be opened. Therefore, it is easy to manufacture the display device having the pressure sensor according to one embodiment of the present invention. The electrical connection between the first conductive film 344 and the wiring used for the source electrode or the drain electrode 148 may be determined by appropriately examination within a scope which does not depart from the present invention.

By arranging the first conductive film to overlap the plurality of pixels in the display device having the pressure sensor according to one embodiment of the present invention, when the display device is pressed with a finger, a capacitance value can be detected over a larger area. That is, it is possible to provide a display device which does not receive the effects of noise and has a pressing sensor with a high detection sensitivity.

Third Embodiment

In the present embodiment, an example of an electrical connection to a second conductive layer of a display device having a pressure sensor according to one embodiment of the present invention is explained. Furthermore, explanations of the same structures as those of the first and second embodiments may be omitted.

Figure 15:
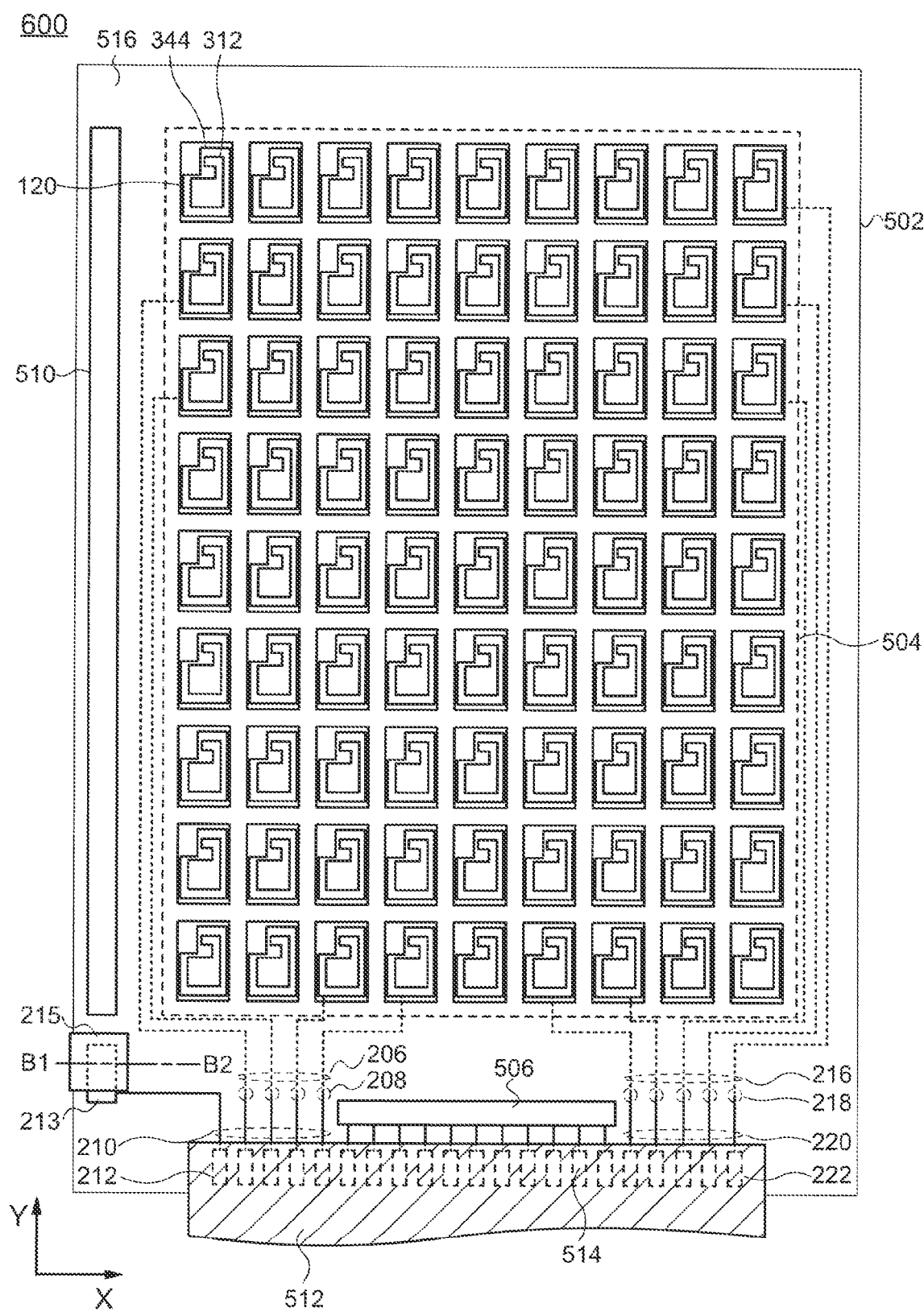
FIG. 15 is a schematic planar view diagram of a display device related to one embodiment of the present invention.

FIG. 15 is a schematic planar diagram of a display device having a pressure sensor according to one embodiment of the present invention. FIG. 15 is the same as FIG. 2 except that an electrical connection with the second conductive layer 505 is added. Therefore, an explanation of the same structure as in FIG. 2 is omitted here.

The connection terminal 213 is electrically connected to the first terminal wiring 210 which is electrically connected to the first terminal 212. For example, the connection terminal 213 can be formed in the same layer as the layer where the source electrode or drain electrode 148 is formed.

A conductive member 215 is electrically connected to the connection terminal 213. The conductive member 215 can be formed using a conductive film or a conductive paste for example.

Figure 16:
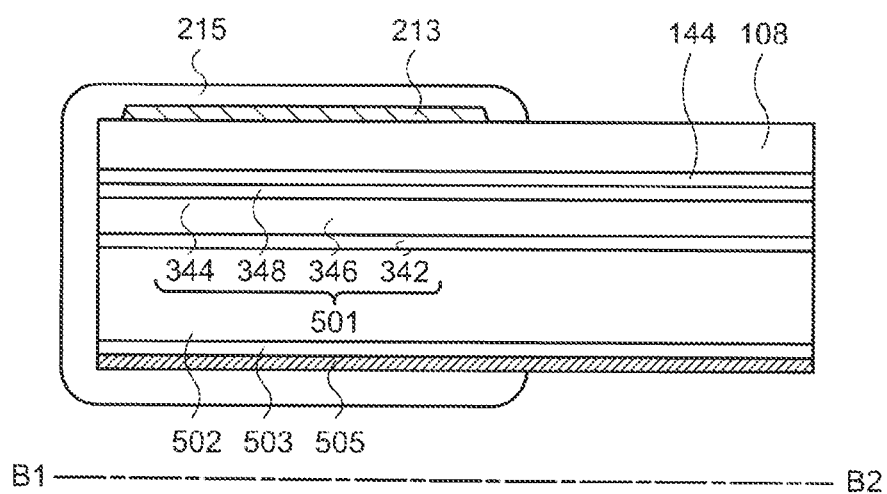
FIG. 16 is a schematic cross-sectional diagram of a display device related to one embodiment of the present invention.

FIG. 16 is a schematic cross-sectional diagram of a display device having a pressure sensor according to one embodiment of the present invention. FIG. 15 is a cross-sectional diagram between B1 and B2. The conductive member 215 is electrically connected to an end surface of the end part of the display device 600 and the second conductive layer 505. The second conductive layer 505 can be electrically connected to the first terminal 212. Therefore, the second conductive layer 505 can be supplied with a constant voltage from the first terminal 212. The constant voltage is 0V or a GND potential for example.

By providing the display device according to one embodiment of the present invention with the structure described above, it is possible to supply a constant voltage to the second conductive layer 505. Therefore, the display device according to one embodiment of the present invention can stably detect capacitance when the display device is pressed. In addition, by detecting a capacitance, it is possible to specify the area where the display device is pressed. In other words, the area of the display device which is pressed can be specified by the pressing sensor included in the display device.

Fourth Embodiment

In the present embodiment, an example is explained in which an on-cell type touch sensor is arranged in a display device having a pressure sensor according to one embodiment of the present invention. Furthermore, explanations of structures similar to those of the first to third embodiments may be omitted.

Figure 17A:
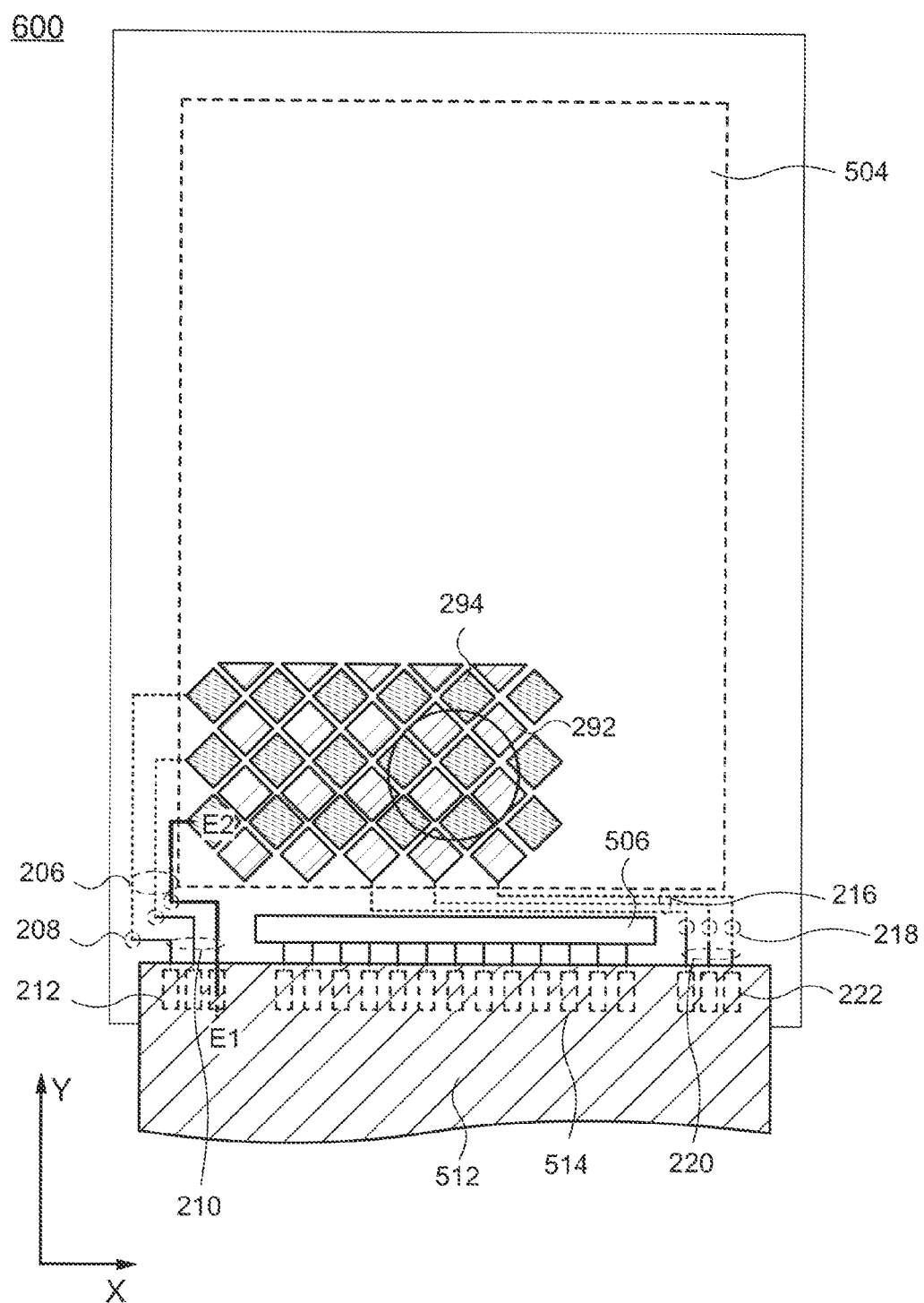
FIG. 17A is a schematic planar view diagram of a display device related to one embodiment of the present invention.
Figure 17B:
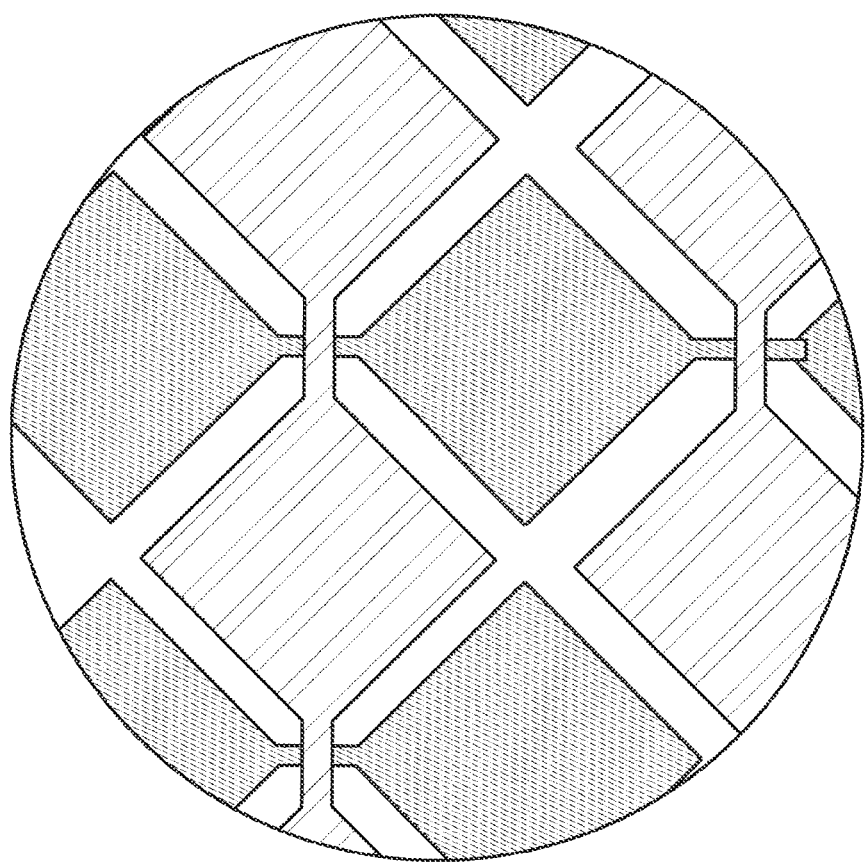
FIG. 17B is a schematic planar view diagram of a display device related to one embodiment of the present invention.

FIG. 17A and FIG. 17B are schematic planar diagrams when an on-cell type touch sensor is arranged in the display device 600 having a pressure sensor according to one embodiment of the present invention. In FIG. 17A, an enlarged view of the regions of the first touch electrode 294 and the second touch electrode 292 are shown in FIG. 17B. When FIGS. 17A and 17B are compared with FIG. 2, except the first touch electrode 294 and the second touch electrode 292 being added they are the same structure. Therefore, an explanation of the same structure as in FIG. 2 is omitted. Furthermore, when FIG. 17A and FIG. 17B are compared with FIG. 2, the pixel 120, the semiconductor film 312, the first conductive film 344, and the scanning signal line drive circuit 508, the scanning signal line drive circuit 510 and the periphery region 516 are omitted.

An example in which a projection type capacitance type touch sensor is applied to the touch sensor which is arranged in a display device according to one embodiment of the present invention is shown. The projection type electrostatic capacitance method is divided into a self capacitance method and a mutual capacitance method.

In the self capacitance method, a detection target such as a human finger touches or approaches the display region 504 via the first touch electrode 294 and the second touch electrode 292, whereby in addition to the parasitic capacitance in the first touch electrode 294 or the second touch electrode 292, a capacitance generated between the detection object and the first touch electrode 294 or the second touch electrode 292 is added. A region where the first touch electrode 294 and the second touch electrode 292 overlap forms a capacitance. It is possible to detect a location which is touched or approached by reading a change in capacitance.

In the mutual capacitance method, one of the first touch electrode 294 and the second touch electrode 292 is also called a transmission electrode (Tx) and the other is also called a reception electrode (Rx). When a detection target such as a human finger touches or approaches the display region 504 via the first touch electrode 294 and the second touch electrode 292, a capacitance formed between the first touch electrode 294 and the second touch electrode 292 changes. It is possible to detect the location which is touched or approached by reading this change.

An example of the shape of the first touch electrode 294 and the shape of the second touch electrode are shown having substantially continuing quadrangular shapes. Since it is possible to increase the area of an electrode by adopting substantially continuing quadrangular shapes, it is possible to reduce the resistance value of the electrode. By adopting substantially continuing quadrangular shapes, it is possible to improve the sensitivity of touch detection when touching or approaching the display device 600.

It is also possible to use the second touch electrode 292 as a wiring electrically connected to the second wiring 216. The second wiring 216 extends outside the display region 504 and is electrically connected to the second terminal wiring 220 via the contact hole 218. The second terminal wiring 220 is exposed in the vicinity of the end part of the display device 600 and forms the second terminal 222. The second terminal 222 is connected to the connector 512. The voltage which is applied to the second touch electrode 292 is provided from an external circuit to the second touch electrode 292 via the second terminal 222. Furthermore, the second wiring 216 may be the first wiring 206. The contact hole 218 may be the contact hole 208. The second terminal wiring 220 may be the first terminal wiring 210. The second terminal 222 may be the first terminal wiring 210. The second terminal 222 may be the first terminal 212.

Figure 18:
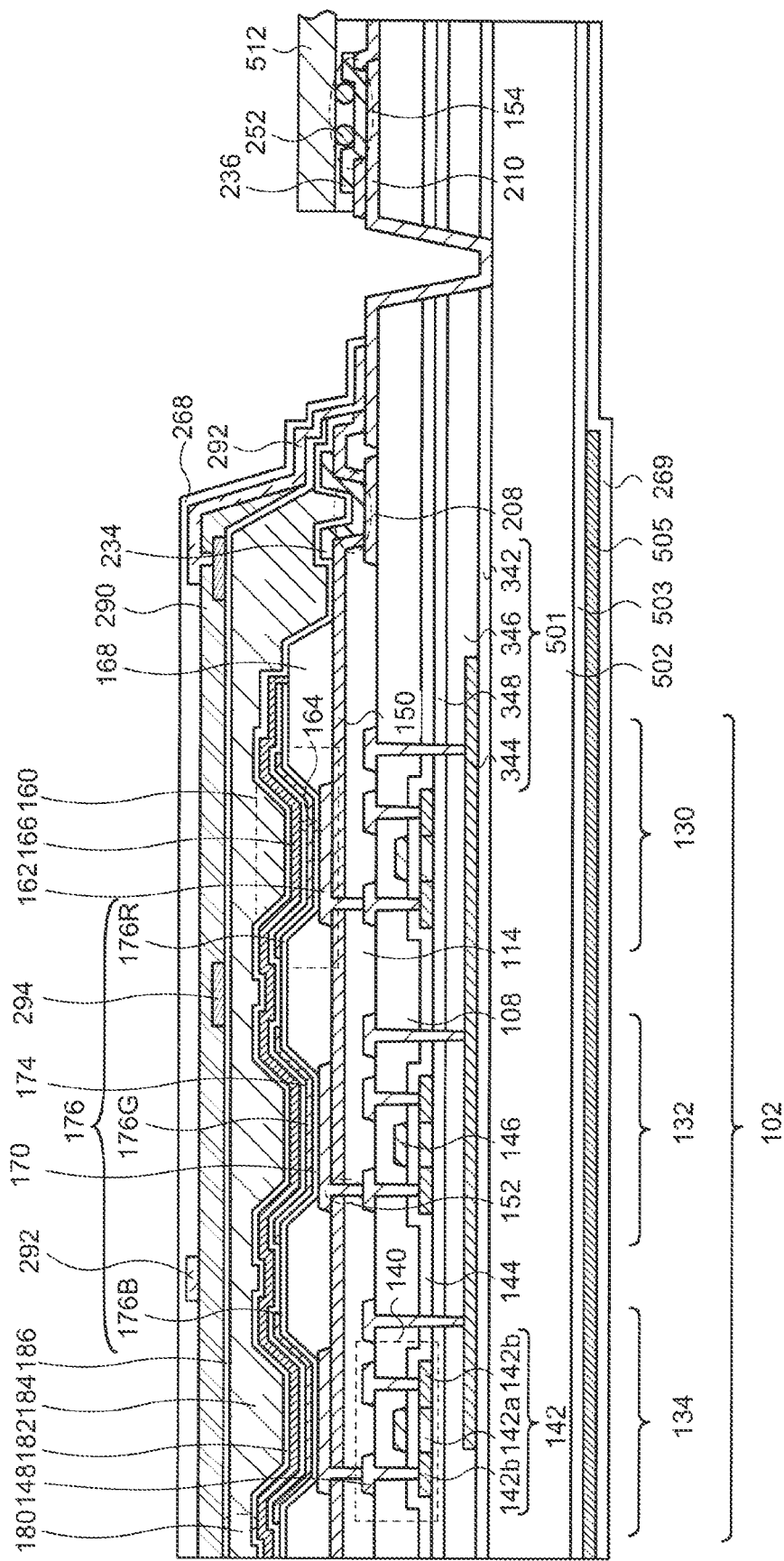
FIG. 18 is a schematic cross-sectional diagram of a display device related to one embodiment of the present invention.

FIG. 18 is a schematic cross-sectional diagram of one embodiment of the present invention shown in FIG. 17. FIG. 18 is the same as FIG. 5 except that the touch electrode interlayer film 290, the first touch electrode 294 and the second touch electrode 292 are added. Therefore, an explanation of the same structure as in FIG. 5 is omitted here.

The second touch electrode 292 can also be used as wiring. The second touch electrode 292 is electrically connected to the first terminal wiring 210. The second touch electrode 292 which is used as wiring is electrically connected to the first touch electrode 294 through an opening part of the touch electrode interlayer film 290. The touch electrode interlayer film 290 insulates the first touch electrode 294 from the second touch electrode 292 and makes touch detection possible when the display device 600 is touched or approached.

By providing the display device according to one embodiment of the present invention with the structure described above, it is possible to arrange an on-cell type touch sensor. Therefore, in the display device according to one embodiment of the present invention, it is possible to detect pressing using the pressing sensor of the display device and specify the position where the display device is pressed using the touch sensor.

Fifth Embodiment

In the present embodiment, an example of a timing chart when pressing is detected in a display device having a pressing sensor according to one embodiment of the present invention is explained. Furthermore, explanations of structures similar to those of the first to fourth embodiments may be omitted.

Figure 19:
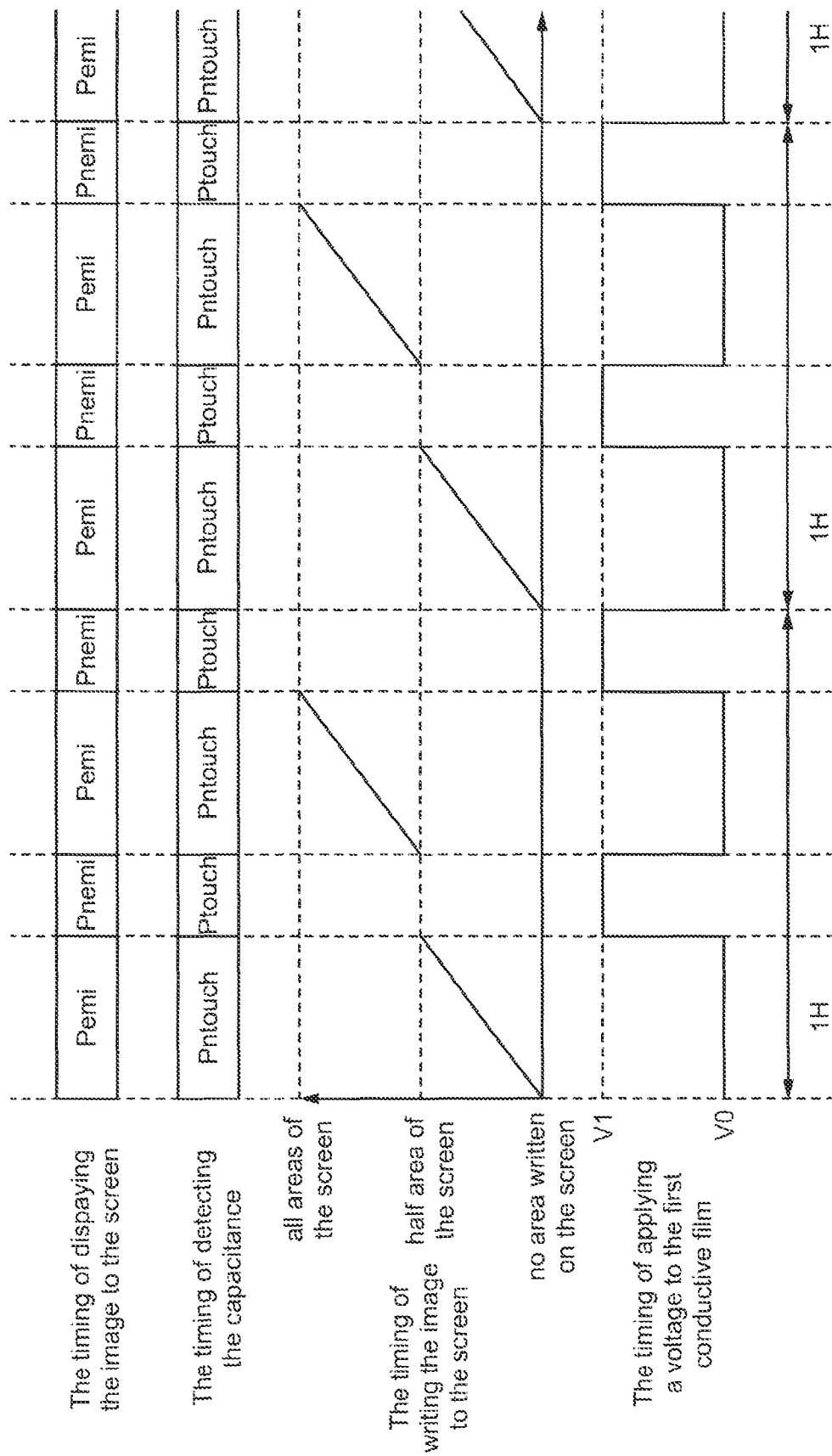
FIG. 19 is a timing chart of a display device related to one embodiment of the present invention.

FIG. 19 is an example of a timing chart of a display device according to one embodiment of the present invention. FIG. 19 has the same structure as the timing chart shown in FIG. 7 except that it is divided into two pieces of data for one screen and each is written to pixels 120 respectively. Therefore, an explanation of the same structure as in FIG. 7 is omitted here.

The horizontal axis in FIG. 19 is time. 1H shown on the horizontal axis represents the time for displaying an image to which half of the data for one screen is written to each pixel 120, the time for detecting the capacitance when a finger presses the display device, the time for displaying an image to which the other half of the data for one screen is written to each pixel 120 and the time for detecting the capacitance when a finger presses the display device. For example, when 1H is 1/60 of a second, half of the data for one screen is written in 1/120 of a second, the pressed capacitance is detected, the other half of the data for one screen is written in the remaining 1/120 of a second and the pressed capacitance is detected. Since detection of the capacitance when pressed can be performed twice in the period 1H, it is possible to improve the accuracy of specifying the pressed area.

Furthermore, the present embodiment may be freely combined with other embodiments described in the present invention.

Each embodiment described above as embodiments of the present invention can be implemented in appropriate combination as long as they do not contradict each other. In addition, appropriate additions, deletions or changes to the design of constituent elements based on the display device of each embodiment, or those in which processes are added, omitted or conditions are changed by a person skilled in the art are included within the scope of the present invention as long as they include the concept of the present invention.

In the present specification, although a display device has mainly been exemplified as a disclosed example, other self-light emitting type display devices, liquid crystal display devices, electronic paper type display devices having electrophoretic elements or the like, and any flat panel type display device can be exemplified as another application example. In addition, the present invention can be applied from medium to small size to large size devices without any particular limitations.

Even if other actions and effects different from the actions and effects brought about by the aspects of each embodiment described above are obvious from the description of the present specification or those which can be easily predicted by a person ordinarily skilled in the art, such actions and effects are to be interpreted as being provided by the present invention.

What is claimed is:

1. A semiconductor device, comprising:
a flexible substrate;
a plurality of thin film transistors (TFTs) on a first side of the flexible substrate;
a first metal layer arranged between a channel of one of the plurality of TFTs and the flexible substrate;
at least one inorganic insulating film arranged between the one of the plurality of TFTs and the first metal layer;
a second metal layer arranged on a second side of the flexible substrate opposite from the first side with respect to the first metal layer;
an organic insulating film arranged between the first metal layer and the second metal layer, and
a first terminal on the first side of the flexible substrate, the first terminal has a conductive layer the same as a source metal layer of the one of the plurality of TFTs or a drain metal layer of the one of the plurality of TFTs, wherein
the second metal layer is electrically connected to the first terminal via a conductive member,
the second metal layer has one electrode which overlaps with whole of the plurality of TFTs uniformly,
the second metal layer does not overlap with the first terminal, and
the first metal layer is arranged between a gate electrode of the one of the plurality of TFTs and the flexible substrate.

2. The semiconductor device according to claim 1, wherein
the organic insulating film is arranged between the flexible substrate and the second metal layer.

3. The semiconductor device according to claim 1, wherein
the organic insulating film has a modulus of elasticity smaller than that of the flexible substrate and smaller than that of the second metal layer.

4. The semiconductor device according to claim 1, wherein
the first metal layer is divided into at least two regions mutually separated from each other.

5. The semiconductor device according to claim 4, wherein
the at least two regions include a first region and a second region,
the plurality of TFTs includes a first TFT and a second TFT,
the first metal layer of the first region is configured to apply a first voltage via the at least one inorganic insulating film to a channel of the first TFT, and
the first metal layer of the second region is configured to apply a second voltage via the at least one inorganic insulating film to a channel of the second TFT.

6. The semiconductor device according to claim 4 further comprising a second terminal on the first side of the flexible substrate and a third terminal on the first side of the flexible substrate, wherein
the at least two regions include a first region and a second region,
the first metal layer of the first region is inputted a first signal from the second terminal, and
the first metal layer of the second region is inputted a second signal from the third terminal.

7. The semiconductor device according to claim 6, wherein
the first signal input to the first metal layer of the first region and the second signal input to the first metal layer of the second region are different signals.

* * * * *